United States Patent [19]

Blomgren et al.

[11] Patent Number: 6,069,497

[45] Date of Patent: May 30, 2000

[54] METHOD AND APPARATUS FOR A N-NARY LOGIC CIRCUIT USING 1 OF N SIGNALS

[75] Inventors: James S. Blomgren; Terence M. Potter; Stephen C. Horne; Michael R. Seningen; Anthony M. Petro, all of Austin, Tex.

[73] Assignee: EVSX, Inc., Austin, Tex.

[21] Appl. No.: 09/019,244

[22] Filed: Feb. 5, 1998

Related U.S. Application Data

[60] Provisional application No. 60/069,250, Dec. 11, 1997.

[51] Int. Cl.[7] .................. H03K 19/094; H03K 19/20; H03K 19/096
[52] U.S. Cl. .................... 326/105; 326/105; 326/112; 326/95; 326/98
[58] Field of Search .................... 326/93, 95, 98, 326/105, 108, 112, 119, 121

[56] References Cited

U.S. PATENT DOCUMENTS

| | | |
|---|---|---|
| 4,851,714 | 7/1989 | Hwang ........................ 326/98 |
| 5,208,489 | 5/1993 | Houston . |
| 5,208,490 | 5/1993 | Yetter . |
| 5,251,176 | 10/1993 | Komatsu . |
| 5,424,734 | 6/1995 | Hirahara et al. . |
| 5,524,088 | 6/1996 | Yoshida . |
| 5,596,539 | 1/1997 | Passow et al. . |
| 5,640,108 | 6/1997 | Miller . |
| 5,668,525 | 9/1997 | Chiu et al. . |
| 5,682,353 | 10/1997 | Eitan et al. . |
| 5,804,989 | 9/1998 | Sato ........................ 326/108 |
| 5,808,932 | 9/1998 | Irrinki et al. . |
| 5,841,719 | 11/1998 | Hirata . |
| 5,867,423 | 2/1999 | Kapoor et al. . |
| 5,870,344 | 2/1999 | Ozawa . |
| 5,892,726 | 4/1999 | Moon et al. . |
| 5,896,343 | 4/1999 | Furumochi . |
| 5,901,081 | 5/1999 | Lahiri . |

*Primary Examiner*—Michael Tokar
*Assistant Examiner*—James H. Cho
*Attorney, Agent, or Firm*—Matthew J. Booth; Booth & Wright, L.L.P.

[57] ABSTRACT

The present invention is a method and apparatus for a N-nary logic circuit that comprises a logic tree circuit that couples to a first set of input logic paths, a second set of input logic paths, and a set of output logic paths, which all use 1 of N signals where one and only one of the N logic paths is active during an evaluation cycle. The preferred embodiment of the present invention uses 1 of 4 signals, while other embodiments of present invention include 1 of 2 signals, 1 of 3 signals, 1 of 8 encoding, and the general embodiment of the 1 of N signals. The logic tree circuit evaluates a given function that includes, for example, an AND/NAND function, an OR/NOR function, or an XOR/Equivalence function. The logic tree circuit uses a single, shared logic tree with multiple evaluation paths for evaluating the function of the logic circuit.

24 Claims, 14 Drawing Sheets

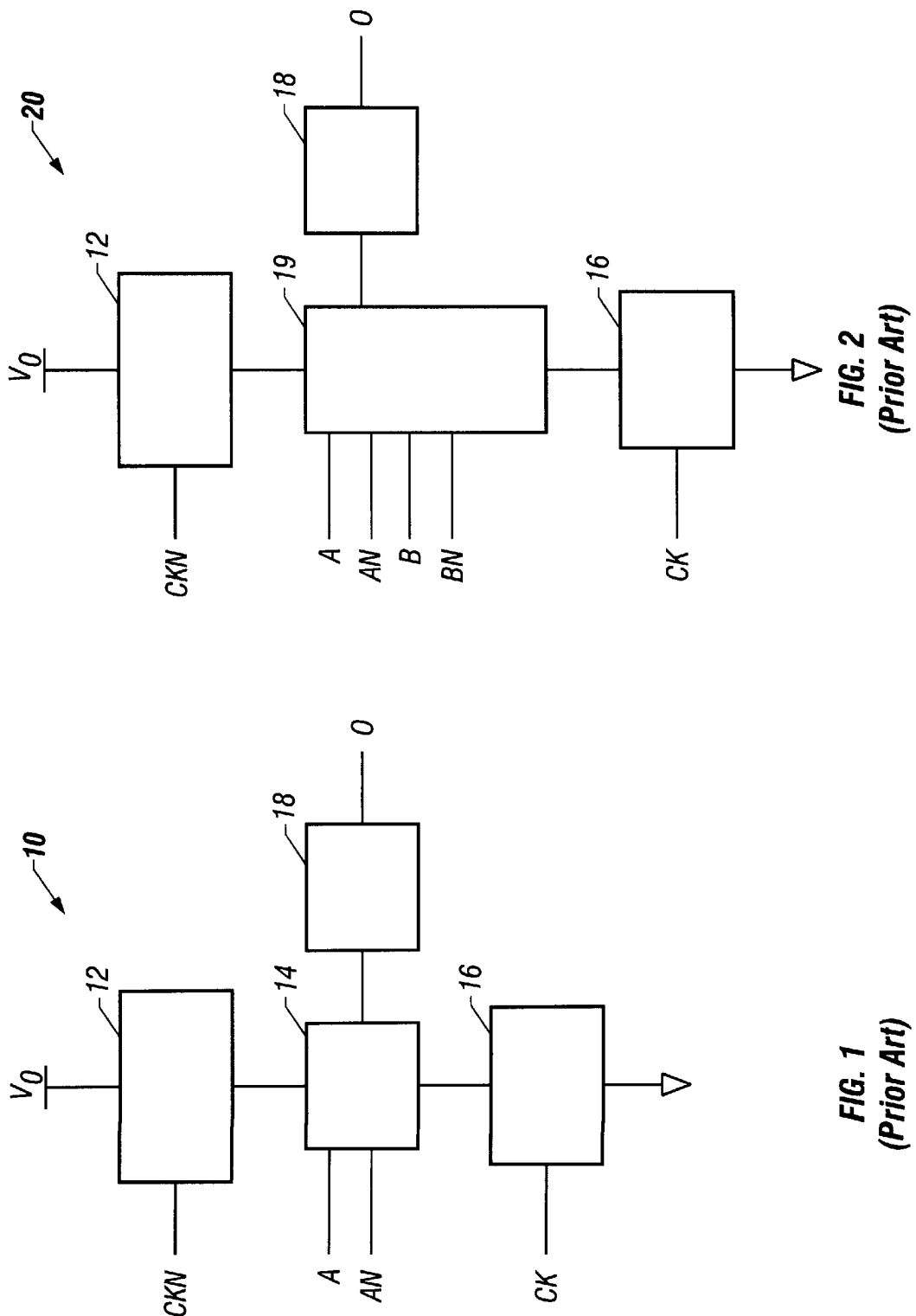

METHOD AND APPARATUS FOR A N-NARY LOGIC CIRCUIT USING 1 OF N SIGNALS

This application claims the benefits of the earlier filed U.S. Provisional Application Ser. No. 60/069,250, filed Dec. 11, 1997, which is incorporated by reference for all purposes into this application.

BACKGROUND OF THE INVENTION

1. Field of the Invention

The present invention relates to semiconductor devices. More specifically, the present invention relates to a functionally complete family of logic.

2. Description of the Related Art

The majority of processor designs use a logic circuit family known as CMOS (Complementary Metal Oxide Semiconductor). A traditional CMOS logic gate consists of a pair of complementary transistors where one transistor is a P-channel field effect transistor (PFET or p-channel device) and the other transistor is a N-channel field effect transistor (NFET or n-channel device). Before CMOS, previous logic circuit families consisted either of bipolar transistors or just one of the two flavors of FETs. The big advantage of CMOS was that it was possible to construct logic families with a low power consumption because power consumption in CMOS occurs only during the switching of the FETs. Since most semiconductor devices initially constructed using CMOS technology were slow by today's standards, the power consumption of a CMOS device was astonishingly low. CMOS gained rapid favor for its ease of construction and simple design rules as well as its tolerance for noise. As a result of its wide popularity, most manufacturing capacity and design research investment in the last several years went into CMOS, which eventually overtook the other types of logic circuit families in nearly every category. Today, most people regard CMOS as the clear winner and preferred choice for virtually every semiconductor logic design task.

CMOS' advantage, that it consumes power only when the FETs are switching, is also its primary disadvantage. The drive for faster clock rates means that the same CMOS circuit that used so little power in the past now requires ever increasing power. Typical CMOS processor designs today consume power in the neighborhood of 50 watts or more. Such power demands (and their related heat dissipation problems) make designing computer systems very difficult.

The large power consumption of current CMOS designs is forcing many designers to consider other types of logic families. One logic family that lends itself to very high clock rates is non-inverting dynamic logic (also called mousetrap logic, domino logic, or asymmetrical CMOS). Non-inverting dynamic logic requires that all information be available both in its true and its complemented form because dynamic logic generally does not allow inverted signals. Not allowing inverted signals, unfortunately, requires us to have twice as many wires or datapaths than in a similar traditional CMOS design. One wire (or datapath) is for the true of the signal, and one wire (or datapath) is for the false of the signal. In dual rail non-inverting dynamic logic, a high on the true datapath is the same as a high in traditional CMOS, and a high on the false datapath is the same as a low in traditional CMOS. For example, a 2-input AND gate in traditional CMOS has just the two inputs because each bit could be either true or false (high or low). In non-inverting dynamic logic, however, a 2 bit AND gate needs 4 inputs because of the redundant representation of data requirement.

Unfortunately, both the redundant representation of data for dual rail non-inverting dynamic logic and its increased switch factor increase the power consumption of logic circuits using this design style because there are more evaluation paths to evaluate and more transistors (overall) that are switching. The prior art for dynamic logic such as U.S. Pat. No. 5,208,490 to Yetter et al or U.S. Pat. No. 5,640,108 to Miller tended to focus on methods for improving the speed and or accuracy (de-glitching) of dynamic logic circuits. None of the prior art for dynamic logic, however, focused on methods or techniques for improving the power consumption of the logic family.

A logic circuit consumes power when conducting current either directly from the power pins to the ground pins or when charging or discharging a capacitor (within the circuit). Most power consumed within a circuit, however, comes from the charging/discharging of the capacitors. A capacitor in a logic circuit occurs due to the inherent or intrinsic physical properties of the circuit that includes the metal wires that are within the circuit itself (i.e., inside the transistors) and the wires in-between the transistors. Metal wires have capacitance that is a function of their dimensional cross section and their proximity to neighboring wires, while the capacitance of transistors is a function of their size. In other words, a logic circuit will consume more power if the circuit contains bigger transistors and or contains more wires or greater lengths of wire. With an increased number of wires and transistors necessary to implement dual-rail non-inverting dynamic logic, this logic family will therefore have a high power consumption to offset its speed advantages.

The present invention overcomes the above power limitations of dual rail dynamic logic by creating a logic family with the speed advantage of dynamic logic without the increased power consumption normally associated with using the logic family.

SUMMARY OF THE INVENTION

The present invention is a method and apparatus for a two bit logic circuit that uses 1 of 4 signals where one and only one of the four logic paths is active during an evaluation cycle. The present invention comprises a logic tree circuit that couples to a first set of input logic paths, a second set of input logic paths, and a set of output logic paths, which all use 1 of 4 signals. The logic tree circuit evaluates a given function that includes, for example, an AND/NAND function, an OR/NOR function, or an XOR/Equivalence function. The logic tree circuit uses a single, shared logic tree with multiple evaluation paths for evaluating the function of the logic circuit. The device of the present invention further comprises a precharge circuit that precharges the transistors in the logic tree circuit and an evaluate circuit that controls the logic tree circuit's evaluation where both couple to the logic tree circuit. And finally, a clock signal couples to the precharge circuit and the evaluate circuit.

The present invention further comprises a method and apparatus for a N-nary logic circuit that uses 1 of N signals wherein one logic path of a plurality of N logic paths has a predefined logic state during an evaluation cycle. The present invention comprises a logic tree circuit coupled to a first plurality of input logic paths, a second plurality of input logic paths, and a plurality of output logic paths where each plurality of logic paths may use one or more 1 of N signals. The logic tree circuit that evaluates a given function that includes, for example, an AND/NAND function, an OR/NOR function, or an XOR/Equivalence function. The logic tree circuit uses a single, shared logic tree with multiple evaluation paths for evaluating the function of the logic circuit. The device of the present invention further comprises a precharge circuit that precharges the transistors in the logic tree circuit and an evaluate circuit that controls the logic tree circuit's evaluation where both couple to the logic tree circuit. And finally, a clock signal couples to the precharge circuit and the evaluate circuit.

The present invention additionally comprises a method and apparatus for an integrated circuit (IC) that uses 1 of N signals to reduce both the circuit's power consumption and the circuit's wire to wire effective capacitance. The present invention comprises a logic tree circuit coupled to a first 1 of N input signal, a second 1 of N input signal, and a 1 of N output signal where the 1 of N signals reduce the device's power consumption and wire to wire capacitance. Other embodiments of the present invention include the use of a 1 of 2 signal, a 1 of 3 signal, a 1 of 4 signal, and a 1 of 8 signal where one and only one of the wires of the signal is active.

The present invention additionally comprises a method and apparatus for routing 2 bits of information with a datapath in a semiconductor device using a 1 of 4 signal. The present invention comprises a first, second, third, and fourth wire for routing a 1 of 4 signal in a semiconductor device. Other embodiments of the present invention include routing 1 of 2 signals, 1 of 3 signals, 1 of 8 signals, and 1 of N signals. One and only one wire of the first, second, third, or fourth wire is active during the evaluation cycle and each active wire represents 2 bits worth of information. Additionally, one and only one wire of the first, second, third, or fourth wire is active during a precharge cycle. The datapath may couple to a logic device. And, other embodiments of the present invention include the ability to route non-inverting signals.

DESCRIPTION OF THE DRAWINGS

To further aid in understanding the invention, the attached drawings help illustrate specific features of the invention and the following is a brief description of the attached drawings:

FIG. 1 is a block diagram of a prior art dual rail domino logic circuit for a one bit input.

FIG. 2 is a block diagram of a prior dual rail domino logic circuit for a two bit input.

DETAILED DESCRIPTION OF THE INVENTION

Figure 4:
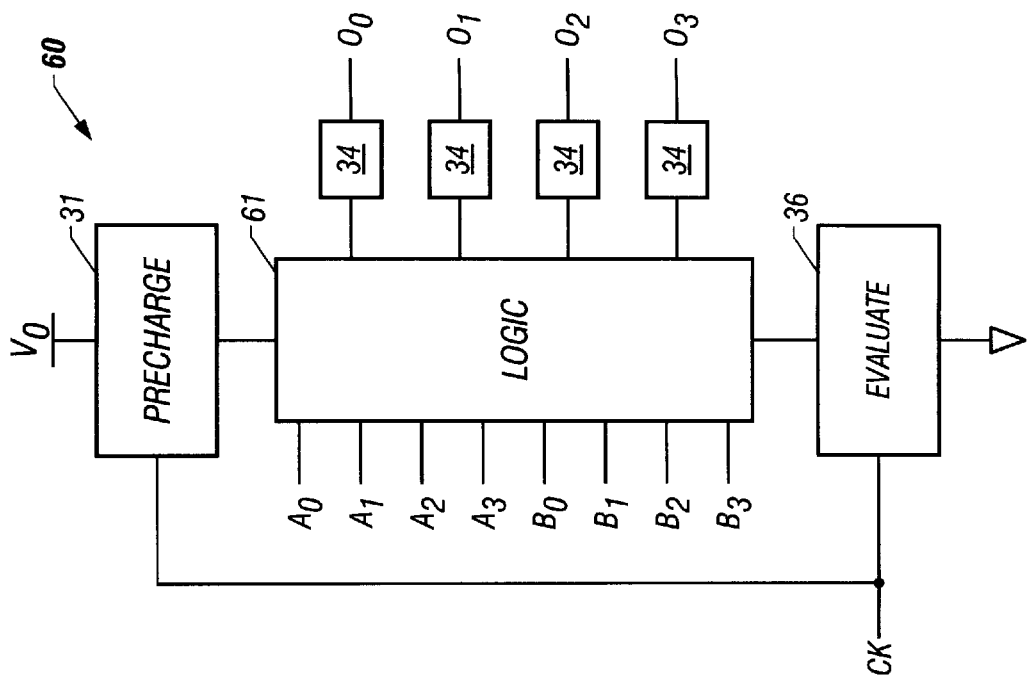
FIG. 4 is a block diagram of an embodiment of an N-nary logic circuit of the present invention using 1 of 4 signals.

The present invention is a method and apparatus for a N-nary logic circuit that use 1 of N signals. This disclosure describes numerous specific details that include specific encodings, structures, circuits, and logic functions in order to provide a thorough understanding of the present invention. For example, the present invention describes circuits with AND/NAND, OR/NOR, and XOR/Equivalence logic functions. However, the practice of the present invention includes logic functions other than the previously described ones such as adders, shifters, or multiplexers. One skilled in the art will appreciate that one may practice the present invention without these specific details. Additionally, this disclosure does not describe some well known structures such as transistors, FETs, domino circuits, and dynamic circuits in detail in order not to obscure the present invention.

The present invention describes the fundamental building blocks of a new logic family, the "N-nary" logic family. The design style using this logic family introduces numerous new concepts, one of which includes the abandonment of strictly binary circuits. While binary signals still exist in this design style, they are uncommon. Instead, trinary and greater signals dominate adders, shifters, boolean units, and even entire datapaths. In fact, the most common signal type of the present invention is quaternary, or four valued, for which we introduce the word "dit" to indicate the two bits (or dual bits) worth of information represented by the quaternary signal. Since the logic family supports many different signal types other than quaternary, we call the design style "N-nary".

The N-nary logic family supports a variety of signal encodings that are of the 1 of N form where N is any integer greater than one. The preferred embodiment of the present invention uses a 1 of 4 encoding that uses four wires to indicate one of four possible values. In the N-nary design style, a 1 of 4 (or a 1 of N) signal is a bundle of wires kept together throughout the inter-cell route, which requires the assertion of no more than one wire either while precharging or evaluating. A traditional design in comparison would use only two wires to indicate four values by asserting neither, one, or both wires together. The number of additional wires represents one difference of the N-nary logic style, and on the surface makes it appear unacceptable for use in microprocessor designs. One of N signals are less information efficient than traditional signals because they require at least twice the number of wires, but N-nary signals have the advantage of including signal validation information, which is not possible with traditional signals. It is this additional information (the fact that when zero wires are asserted the result is not yet known) that indirectly allows us to eliminate P-channel logic and all of the series synchronization elements required in traditional designs.

Another advantage of the N-nary logic family is that N-nary signals include both true and false information, which means inverters are never required. This is important in two respects. First, a static design can no more avoid logical inversion than can N-nary logic. Although not obvious with any signal encoding other than 1 of 2 encoding, N-nary logic produces the logical inversion at each gate all the time. Static design often requires the inversion of signals, and so places inverters near the signal's destination.

Another advantage about the N-nary logic family is that it allows the designer to perform logic evaluations using a single type of transistor, for example, N-channel only logic or P-channel only logic. The preferred embodiment of the present invention uses N-channel only devices, while other embodiments provide for P-channel only devices. With the preferred embodiment, there are several benefits to N-channel only evaluation gates relative to traditional static gates. The first is the elimination of P-channel devices on input signals, the second is the elimination of the need to build the complementary function in P-channel devices, and the third is the ability to share the N-channel evaluation "stack" among multiple outputs. Sharing portions of the evaluate "stack" among multiple outputs is not possible with static CMOS gates because it is not possible to obtain each output's function and complement from shared devices in both the P and N-channel stacks. Other dynamic logic families such as MODL, or Multiple Output Dynamic Logic, can produce multiple outputs by leveraging the fact that sub-functions are naturally available within dynamic evaluation stacks. The N-nary design style does not use sub-functions within evaluation stacks to produce multiple outputs. Instead, the N-nary design style uses separate evaluation stacks to directly produce the multiple outputs. The N-nary design style is similar to MODL in its ability to reduce transistor counts, but is superior in its ability to produce fast, power efficient circuits.

Compared to static CMOS gates, the savings are dramatic.

Another feature of the N-nary logic style is the switching speed of the gates. Some embodiments of the N-nary design style allow the designer to limit the "stack height" or the number of transistors in the evaluation path. For example, one embodiment of the present invention uses no more than 2 transistors in an evaluation path (between the precharge circuit and the evaluate circuit), while another embodiment of the present invention uses no more than 3 transistors in an evaluation path. Other embodiments of the present invention allow for greater stack heights in the evaluation path.

To help understand the N-nary logic family, one must first look at earlier logic families and design styles. FIG. 1 illustrates a typical prior art dual rail dynamic logic circuit 10 for a one bit input. Since this logic circuit is non-inverting dynamic logic, the input wires leading into the circuit contain information that has both the true and its complemented form of an input data signal. The signal A contains the true form of the signal when high, and the signal AN contains the false form of the signal when high. The input wires or logic paths for the signals A and AN couple to a logic tree circuit 14 that performs a selected logic function to produce an output signal O on the output wires. The output wires or logic paths for the output signal O may have a buffer 18 that inverts the signal and or helps in driving additional logic circuits. A clock signal CK controls the evaluation of the logic tree circuit 14, while an inverted clock signal CKN (that may be the inverse of CK or a separate signal) controls the precharge of the dynamic logic within logic tree circuit 14. In some designs, CK is used for both the precharge device 12 and the evaluate device 16. The fact that the precharge device is a p-channel device and the evaluate device is an n-channel device produces the distinct phases. Referring back to FIG. 1, if the function of the logic tree circuit 14 performed an inversion, then a truth table for the function would be the following:

TABLE 1

| a | o | A | AN | O |
|---|---|---|----|---|
| 0 | 1 | 0 | 1  | 1 |
| 1 | 0 | 1 | 0  | 0 |

In the above table, a represents the Boolean input signal and o represents the Boolean output signal. An additional state not listed in TABLE 1 is A and AN both being high concurrently, which is not possible (it is an invalid state) because by definition for dual rail non-inverting dynamic logic, a must be either A or AN.

FIG. 2 illustrates a typical prior art dual rail dynamic logic circuit 20 for a two bit input (a and b) with input signals A and B and their complemented input signals AN and BN. The input wires for the input signals couple to a logic tree circuit 19 that performs a selected logic function to produce a one bit output (o) for the output signal O. The output wires for the output signal O may have a buffer 18 coupled to the wires that inverts the signal and or helps in driving additional logic circuits. Prior art dynamic circuits such as U.S. Pat. No. 5,208,490 to Yetter et al or U.S. Pat. No. 5,640,108 to Miller or even MODL devices included an additional output signal for the complemented form of the output O. However, these prior art circuits such as Yetter typically used separate logic tree circuits and or separate evaluate devices to generate sub-functions of the output or the complemented form of the output signal. Referring back to FIG. 2, a clock signal CK controls the evaluation of the logic tree circuit 19, while an inverted clock signal CKN controls the precharge of the dynamic logic within the logic tree circuit 19. If the function of the logic tree circuit 19 performed an OR function, then a truth table for the function would be the following:

TABLE 2

| a | b | o | A | AN | B | BN | O |
|---|---|---|---|----|---|----|----|
| z | z | z | 0 | 0  | z | z  | 0 |
| z | z | z | z | z  | 0 | 0  | 0 |
| 0 | 0 | 0 | 0 | 1  | 0 | 1  | 0 |
| 0 | 1 | 1 | 0 | 1  | 1 | 0  | 1 |
| 1 | 0 | 1 | 1 | 0  | 0 | 1  | 1 |
| 1 | 1 | 1 | 1 | 0  | 1 | 0  | 1 |

Prior art dynamic logic circuits such as Yetter defined certain inputs to the logic circuit as invalid or do not care states in the truth table. The above table represents these invalid states (or inputs) or do not care states (or inputs) with the symbol z. An additional state not listed in TABLE 2 is where all the signals A, AN, B, and BN are high (or asserted) concurrently. This state is not possible (it is an invalid state) because the definition of dual rail non-inverting dynamic logic requires a to be either A or AN and b to be either B or BN.

One of the disadvantages of prior art dynamic logic circuits is their power consumption. As previously noted, power consumption occurs during the switching of the FETs within a circuit when conductive pathways are open between the power pins and the ground pins or when charging/discharging the capacitors of the circuit.

Power is proportional to the amount of charge moved and the potential it is moved across. When a capacitor discharges, the amount of charge is given by:

$$Q = CV \quad (1)$$

Where Q is the quantity of charge,
C is the capacitance, and
V is the voltage.

Thus, the energy involved with charging or discharging a capacitor is given by:

$$E = CV^2 \quad (2)$$

If we have a circuit with a processor, the power that circuit consumes is given by the energy involved with charging or discharging its capacitance per second:

$$P = fsCV^2 \quad (3)$$

Where f is the frequency of the part, and
s is the switch factor for the circuit.

The switch factor for a signal is an indication of how often the signal switches per cycle, and is a simple ratio. Typical static CMOS signals may have an average switch factor of approximately 0.20. A dual rail dynamic signal has two wires, one of which is guaranteed to evaluate and precharge. This means that in each cycle, one of the two wires switches twice, for a switch factor of 1.0. In contrast, an N-nary logic function with a 1 of 4 signal contains four wires, exactly one of which evaluates and then precharges, for a switch factor of 0.50. If the frequency, capacitance, and voltage are held constant for these three logic families, then N-nary 1 of 4 logic will use half the power that dual rail dynamic logic uses.

Any increase in capacitance will increase the power consumption of a dynamic logic device when it evaluates. One example of an increase in capacitance within a circuit occurs from the wire to wire capacitance from adjoining wires when the adjoining logic paths' or wires are concurrently conducting signals. The prior art dynamic logic circuit of FIG. 2 and Table 2 illustrates the wire to wire capacitance problems with adjoining wires because at least 2 of the input logic paths will be conducting a signal for any given input combination.

The present invention overcomes the above problems by creating the N-nary logic family that uses 1 of N encoding to reduce the number of conducting (or active) wires or logic paths (carrying signals) that a logic tree will evaluate in a given evaluation cycle. There are a variety of techniques to encode information that includes for example binary encoding where a N-bit binary number can represent $2^N$ possible values. However, one of our requirements is that there is a value or number representation that indicates when the signal or group of signals is NOT valid (in other words, we expect each signal to indicate its validity). We also want to avoid having adjacent wires having concurrent high signals that leads us to add that one and only one logic path in the 1 of N encoding has an active high signal (or an active high logic state) on it during a single evaluation cycle when the data signal is available. All of these additional conditions prompts us to modify the form of encoding since the convenient arrangement of $_2N$ values for N bits is no longer possible. As a result, we end up with at least two wires (in most cases) for each single bit of binary information, where each signal indicates when it is valid on the logic path by transitioning to a high state, and where one signal indicates a logical zero when it is high, and another signal indicates a logical one when it is high, which results in the following definition table:

TABLE 3

| A | AN | Meaning |
| --- | --- | --- |
| 0 | 0 | Value not yet available |
| 0 | 1 | Value available, |
| 1 | 0 | Value available, one |
| 1 | 1 | Unused encoding (shouldn't happen) |

We call the encoding in the above table a 1 of 2 encoding where the encoding efficiency is N possible values per N wires. In the present invention, the definition of the state where the true of the signal (A) and the false or complement of the signal (AN) are (0,0) means that the device of the present invention is in precharge or that the data signal has not arrived. With the timing of the data signal embedded into the signal itself, the transition of either A or AN to high indicates both the arrival of the signal and the value of the signal, i.e., whether it's true (on A) or false (on AN).

We can extend the above encoding rules to additional or multiple bits. For example, with 2 bits (which can use 4 wires as 1 of 4 encoding), we can have four possible combinations for what the two binary bits can have: 0, 1, 2 and 3. For 3 bits (which can use 8 wires as 1 of 8 encoding), we have eight combinations: 0, 1, 2, 3, 4, 5, 6 and 7. The following table illustrates some of the encodings possible with 1 of N encoding:

TABLE 4

| 1 of 3 | 1 of 4 | 1 of 8 | 1 of 16 | Meaning |
| --- | --- | --- | --- | --- |
| 000 | 0000 | 00000000 | 0000000000000000 | Value not yet available |
| 001 | 0001 | 00000001 | 0000000000000001 | Value available, 0 |
| 010 | 0010 | 00000010 | 0000000000000010 | Value available, 1 |
| 100 | 0100 | 00000100 | 0000000000000100 | Value available, 2 |
|  | 1000 | 00001000 | 0000000000001000 | Value available, 3 |
|  |  | 00010000 | 0000000000010000 | Value available, 4 |
|  |  | 00100000 | 0000000000100000 | Value available, 5 |
|  |  | 01000000 | 0000000001000000 | Value available, 6 |
|  |  | 10000000 | 0000000010000000 | Value available, 7 |
|  |  |  | 0000000100000000 | Value available, 8 |
|  |  |  | 0000001000000000 | Value available, 9 |
|  |  |  | 0000010000000000 | Value available, 10 |
|  |  |  | 0000100000000000 | Value available, 11 |
|  |  |  | 0001000000000000 | Value available, 12 |
|  |  |  | 0010000000000000 | Value available, 13 |
|  |  |  | 0100000000000000 | Value available, 14 |
|  |  |  | 1000000000000000 | Value available, 15 |

Note that 1 of 4 encoding provides 4 possible values or two binary bits worth of information. A 1 of 8 encoding provides 8 possible values or three binary bits worth of information. And, a 1 of 16 encoding provides 16 possible values or four binary bits worth of information.

Since the encoding efficiency is N possible values of information per N wires, the encoding efficiency per wire decreases with the higher one of N encodings (as N increases). An increasing number of wires produces a wire disadvantage for higher one of N encodings:

TABLE 5

| encoding | wires | binary bits | wires per bit |
|---|---|---|---|
| 1 of 2 | 2 | 1 | 2.0 |
| 1 of 3 | 3 | 2.0 | 1.5 |
| 1 of 4 | 4 | 2 | 2.0 |
| 1 of 8 | 8 | 3 | 2.7 |
| 1 of 16 | 16 | 4 | 4.0 |
| 1 of 32 | 32 | 5 | 6.4 |
| 1 of 64 | 64 | 6 | 10.3 |
| 1 of 128 | 128 | 7 | 18.3 |
| 1 of 256 | 256 | 8 | 32.0 |

Figure 3:
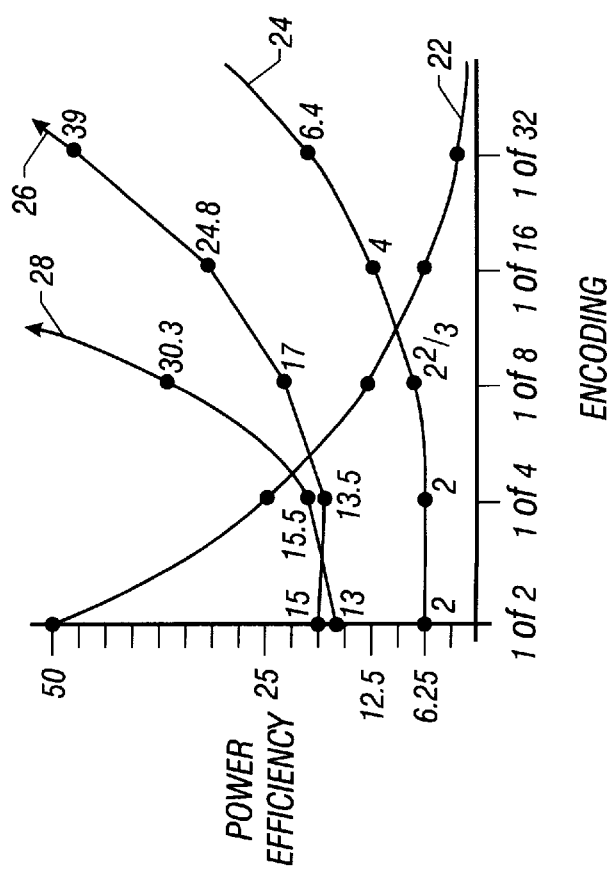
FIG. 3 illustrates the efficiency of the present invention.

The degree of encoding determines the encodings wire efficiency. For example, a 1 of 2 signal requires two wires to encode one bit of information. A 1 of 3 signal requires 3 wires to encode 2 bits of information, which is 1.5 wires per bit of information and is very efficient. A 1 of 4 signal requires four wires to encode four values, or the equivalent of two bits of information. In the 1 of 2 encoding and 1 of 4 encoding cases, the wire efficiency is two wires per bit of information. A 1 of 8 signal requires eight wires to encode three bits of information, which is 2.7 wires per bit of information, less efficient than the prior encodings. Similarly, 1 of 16, 1 of 32 and 1 of 64 have wire efficiencies of 4, 6.4 and 10.7 respectively. As Table 5 illustrates, 1 of 2 and 1 of 4 encodings are equally efficient, and a 1 of 3 encoding is even more efficient. (1 of e is the most efficient, but is not achievable using on/off signals). For example, six wires can encode three 1 of 2 signals or two 1 of 3 signals. Three 1 of 2 signals provide eight possible values, while two 1 of 3 signals provide nine, or one more value than the three 1 of 2 signals. Line 24 of FIG. 3 illustrates the wire cost per bit information for the 1 of N encodings. Higher degrees of 1 of N encoding quickly become expensive in terms of wire efficiencies. Unless there is an important functional, topological, or power requirement, it is usually not advantageous to use encodings beyond 1 of 8. Within RAMs, however, the word lines are one example where, due to topology, a 1 of 128 encoding can make perfect sense.

The switch factor of a circuit is important because it directly determines power consumption and indirectly determines circuit speed. The power consumption in a logic circuit varies according to how many wires evaluate per bit of encoded information. If the circuit has a high power consumption, we must provide more route resources to connect gates to power and ground and also require that some devices be larger, (especially the evaluate devices in N-nary cells). Using a 1 of N encoding reduces the power consumption for a given logic circuit. In a given cycle, one data signal in any of the above 1 of N encodings will evaluate, such that a 1 of 2 encoding has 50% of its wires evaluate, a 1 of 3 encoding has 33% of its wires evaluate, a 1 of 4 encoding has 25% of its wires evaluate, a 1 of 8 encoding has 12.5% of its wires evaluate, etc. Therefore, more wires provide a power consumption advantage for higher 1 of N encodings:

TABLE 6

| encoding | wires | binary bits | per bit | power consumption |
|---|---|---|---|---|
| 1 of 2 | 2 | 1 | 2.0 | 50.0% |
| 1 of 3 | 3 | 2 | 1.5 | 33.3% |
| 1 of 4 | 4 | 2 | 2.0 | 25.0% |
| 1 of 8 | 8 | 3 | 2.7 | 12.5% |
| 1 of 16 | 16 | 4 | 4.0 | 6.3% |

TABLE 6-continued

| encoding | wires | binary bits | per bit | power consumption |
|---|---|---|---|---|
| 1 of 32 | 32 | 5 | 6.4 | 3.1% |
| 1 of 64 | 64 | 6 | 10.3 | 1.6% |
| 1 of 128 | 128 | 7 | 18.3 | 0.8% |
| 1 of 256 | 256 | 8 | 32.0 | 0.4% |

Implementing devices in 1 of N encodings can either be advantageous or disadvantageous from a power efficiency perspective and depends on the function of the device (e.g., ADD, Boolean AND, OR, etc.). Functions that desire adjacent bit information to be pre-encoded, such as adders, experience a reduced power consumption (power efficiency) advantage for using higher one of N encodings. Functions that do not want adjacent bit information encoded such as OR gates experience a reduced power consumption (power efficiency) disadvantage for higher one of N encodings. Functions that do not alter the values, such as multiplexers and storage elements experience neither a reduced power consumption advantage nor a disadvantage for higher 1 of N encodings. An additional consideration to the reduced power consumption (power efficiency) advantage or disadvantage is the cost of the additional wires per bit, which is an important consideration in constructing transistor gates.

Tables 7 and 8 illustrate the reduced power consumption for 1 of N encodings for different functions. Table 7 illustrates the complexity (the transistor count) of an example OR gate in various 1 of N encodings as follows:

TABLE 7

| Encoding | evaluate tree | per output | evaluate device | Total | per Bit |
|---|---|---|---|---|---|
| 1 of 2 | 4 | 2 × 4 | 1 | 13 | 13.0 |
| 1 of 4 | 14 | 4 × 4 | 1 | 31 | 15.5 |
| 1 of 8 | 58 | 8 × 4 | 1 | 91 | 30.3 |
| 1 of 16 | 242 | 16 × 4 | 1 | 307 | 76.8 |
| 1 of 32 | 994 | 32 × 4 | 1 | 1123 | 224.6 |

Similarly, for a multiplexer, the gate complexity is as follows:

TABLE 8

| Encoding | evaluate tree | per output | evaluate device | Total | per Bit |
|---|---|---|---|---|---|
| 1 of 2 | 6 | 2 × 4 | 1 | 15 | 15.0 |
| 1 of 4 | 10 | 4 × 4 | 1 | 27 | 13.5 |
| 1 of 8 | 18 | 8 × 4 | 1 | 51 | 17.0 |
| 1 of 16 | 34 | 16 × 4 | 1 | 99 | 24.8 |
| 1 of 32 | 66 | 32 × 4 | 1 | 195 | 39.0 |

The OR gate example of Table 7 shows that there is a power efficiency disadvantage to the higher 1 of N encodings when we do not want adjacent information encoded into each bit position. The multiplexer example shows that there actually is an advantage to a 1 of 4 encoding because the multiplexer treats data without regard to its encoding (included within this advantage is that there is a sharing of portions of the evaluate tree and the evaluate device). Note that most structures in a microprocessor are multiplexers.

To summarize the power consumption for 1 of N encodings as N increases, we have the following table:

TABLE 9

| Encoding | wires | binary bits | wires per bit | switch factor (power) | OR transistors per bit | MUX transistors per bit |
|---|---|---|---|---|---|---|
| 1 of 2 | 2 | 1 | 2.0 | 50.0% | 13.0 | 15.0 |
| 1 of 4 | 4 | 2 | 2.0 | 25.0% | 15.5 | 13.5 |
| 1 of 8 | 8 | 3 | 2.7 | 12.5% | 30.3 | 17.0 |
| 1 of 16 | 16 | 4 | 4.0 | 6.3% | 76.8 | 24.8 |
| 1 of 32 | 32 | 5 | 6.4 | 3.1% | 224.6 | 39.0 |

FIG. 3 is an illustration of Table 9 that shows the power efficiency per wire of the present invention as N increases for 1 of N encodings. Line 22 illustrates the reduction in power consumption for higher 1 of N encodings. Line 24 illustrates the wires per bit for the 1 of N encodings. Line 26 illustrates transistors per bit for the multiplexer example (from Table 8), and line 28 illustrates the transistors per bit of the OR example (from Table 7).

From the above, we see that a 1 of 4 encoding appears to have a very good combination of wire and transistor efficiency and low power consumption. Normalizing Table 9 to a 1 of 4 encoding we get the following:

TABLE 10

| Encoding | wires | binary bits | wires per bit | Normalized switch factor (power) | OR transistors per bit | MUX transistors per bit |
|---|---|---|---|---|---|---|
| 1 of 2 | 2 | 1 | 2.0 | 2.00 | 0.8 | 1.1 |
| 1 of 4 | 4 | 2 | 2.0 | 1.00 | 1.0 | 1.0 |
| 1 of 8 | 8 | 3 | 2.7 | 0.50 | 2.0 | 1.3 |
| 1 of 16 | 16 | 4 | 4.0 | 0.25 | 5.0 | 1.8 |
| 1 of 32 | 32 | 5 | 6.4 | 0.13 | 14.5 | 2.9 |

The above discussion of the 1 of N encoding of the present invention allows us to define a 1 of N signal as a plurality of wires (the physical metal trace), one and only one of which can evaluate true, which indicates the signal's value (or predefined logic state). For example, a 1 of 4 signal is a signal composed of 4 wires, and can communicate four different values using 1 of 4 encoding, or two bits of information. Another example is a 1 of 2 signal that is a signal composed of 2 wires, and can communicate two values using 1 of 2 encoding, or one bit of information. And, another example is a 1 of 8 signal that is a signal composed of 8 wires, and can communicate values using 1 of 8 encoding, or three bits of information.

FIG. 4 illustrates one embodiment of the present invention using two sets of 1 of 4 signals for the input signals and a 1 of 4 signal for the output signal. This embodiment of the present invention describes a 2 bit logic gate (a dit) where a is a 2 bit input, b is a 2 bit input, and o is a 2 bit output. In other words, a dit device comprises input bits and 2 output bits. The present invention describes an entire family of 2 bit or dit Boolean logic gates in N-nary logic using one of N encoding for the signals.

Referring to FIG. 4, a device 60 comprises a logic tree circuit 61, a precharge circuit 31, and an evaluate circuit 36. Coupled to the logic tree circuit is the 2 bit input signal a, which is a 1 of 4 signal that comprises a plurality of input values $A_0$, $A_1$, $A_2$, and $A_3$ and their associated wires or logic paths using a 1 of 4 encoding. Additionally coupled to the logic tree circuit is the 2 bit input b, which is another 1 of 4 signal that comprises a plurality of input values $B_0$, $B_1$, $B_2$, and $B_3$ and their associated wires or logic paths using a 1 of 4 encoding. And, coupled to the logic tree circuit is the 2 bit output o, which is a 1 of 4 signal that comprises a plurality of output values $O_0$, $O_1$, $O_2$, and $O_3$ and their associated wires or logic paths using a 1 of 4 encoding. The logic tree circuit 61 performs a logic function on a plurality of input signals that could comprise a variety of functions, for example, the Boolean logic functions AND/NAND, OR/NOR, or XOR/Equivalence. The logic tree circuit 61 comprises one or more FETs with the preferred embodiment of the logic tree circuit comprising N-channel FETs.

Coupled to the wires of the plurality of output signals are the output buffers 34 that aid in driving additional circuits that couple to the output signals. The preferred embodiment of the present invention uses an output buffer with an inverting function as the output buffer 34. Another embodiment of the present invention comprises a non-inverting buffer as the output buffer. And, another embodiment of the present invention does not use an output buffer, instead, the plurality of output signals couples directly to other circuits.

A precharge circuit 31 couples to the logic tree circuit 61 and precharges the dynamic logic of the logic tree circuit. The precharge circuit 31 comprises one or more FETs with the preferred embodiment of the circuit comprising P-channel FETs. Each evaluation path of the logic tree circuit has its own precharge P-FET. Coupled to the precharge circuit 31 is the clock signal CK. A low clock signal on CK will cause the FETs in the logic tree circuit 32 to charge when using P-channel FETs in the precharge tree circuit.

An evaluate circuit 36 couples to the logic tree circuit and controls the evaluation of the logic tree circuit. The evaluate circuit 36 comprises one or more FETs with the preferred embodiment of the circuit comprising a single N-channel FET. Coupled to the evaluate circuit 36 is the clock signal CK. A high clock signal on CK will cause the FETs in the logic tree circuit 32 to evaluate when using N-channel FETs in the evaluate circuit.

Figure 6:
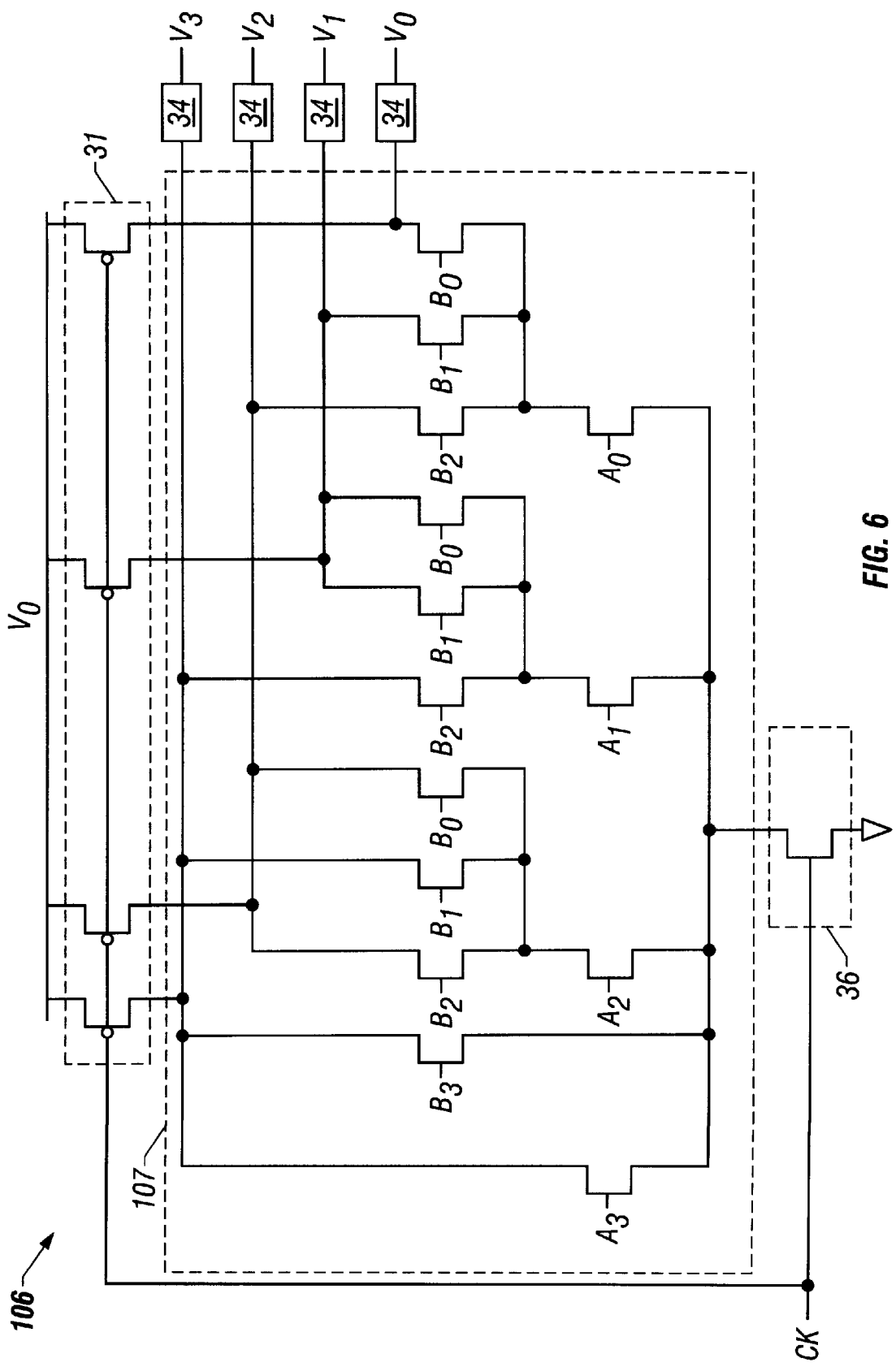
FIG. 6 is a circuit diagram of one embodiment of the present invention for the OR/NOR function for a N-Nary logic circuit with a dit (2-bit) device using 1 of 4 signals.

If the logic function of logic tree circuit 61 performed an OR/NOR function as found in the circuit of FIG. 6, then the resulting truth table would be Table 11. The mapping of the 1 of 4 encoding for the output comprises a variety of truth tables other than the example above and is dependent on the circuit design. However, Table 11 illustrates that one and only one logic path of the 1 of N encoding has an active high value (or an active logic state) on it during a single evaluation cycle when the data signals are available. In FIG. 4, there are 2 sets of 1 of 4 signals for the input signals and a 1 of 4 signal for the output signal. The present invention provides that the input or output signals may have multiple sets of 1 of N signals using of 1 of N encoding. For example, in each state in Table 11 for the input wires or logic paths $A_0$ through $A_3$, there is one and only one input logic path or wire that has an active high value on it. In each state in Table 11 for the input logic path $B_0$ through $B_3$, there is one and only one input logic path or wire that has an active high value on it. And, in each state in Table 11 for the output logic paths $O_0$ through $O_3$, there is one and only one output logic or wire path that has an active high value on it.

Figure 5B:
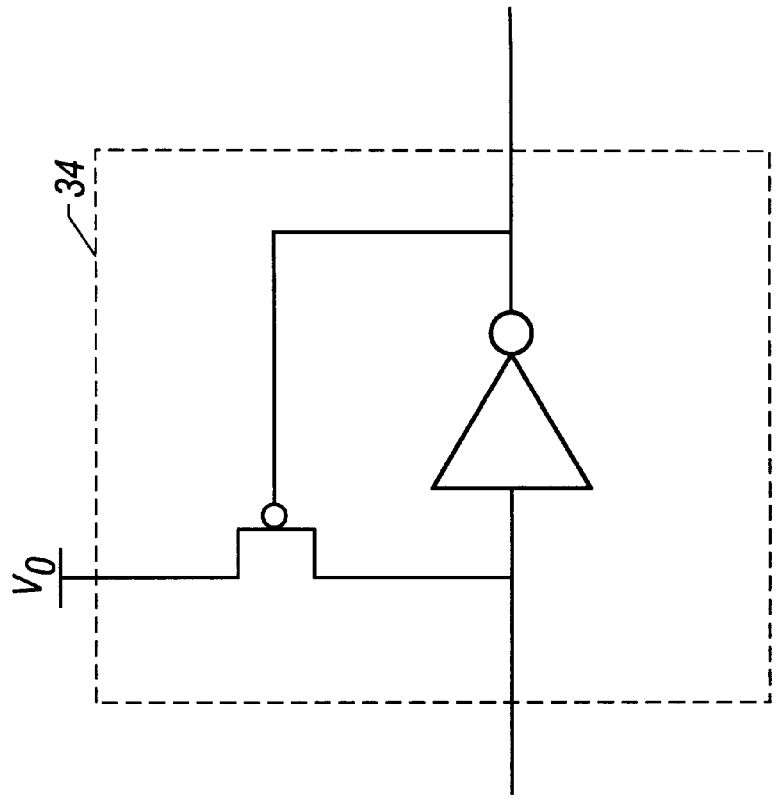
FIGS. 5A and 5B illustrate alternative circuit layouts for output buffers.
Figure 5A:
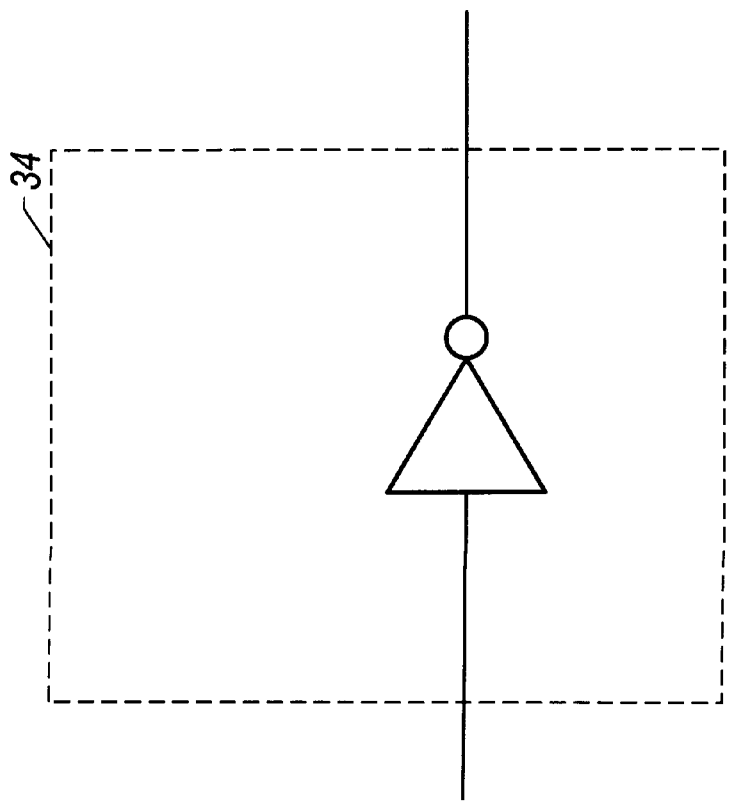

FIGS. 5A and 5B illustrate alternative circuit layouts for output buffers. FIG. 5A shows a CMOS inverter for inverting the signal on an output logic path. FIG. 5B shows the preferred embodiment of an output buffer that shows a CMOS inverter for inverting the signal and a feed back keeper transistor for maintaining the level of the dynamic node before the signal evaluates, which gives a logic gate using this buffer a static capability. Additionally, this type of output buffer compensates for parasitic leakages and allows for low speed functionality.

FIG. 6 is a circuit diagram of one embodiment of the present invention for the OR/NOR function using a 1 of 4 encoding. One skilled in the art will appreciate that one function is the inverse of the other function. A device 106 is a dit (a 2 bit) device that has two 2 bit inputs and a 2 bit output that comprises a precharge circuit 31, an evaluate circuit 36, and a logic tree circuit 107. One of the 2 bit input signals comprises a 1 of 4 signal with a plurality of input values $A_0$, $A_1$, $A_2$, and $A_3$ and their associated wires that couple to the logic tree circuit 107 using a 1 of 4 encoding of the present invention. The other 2 bit input comprises a 1 of 4 signal with a plurality of input values $B_0$, $B_1$, $B_2$, and $B_3$ and their associated wires that couple to the logic tree circuit 107 using a 1 of 4 encoding of the present invention. A 1 of 4 signal with a plurality of output values $V_0$, $V_1$, $V_2$, and $V_3$ and their associated wires for the 2 bit output couple to the logic tree circuit 107 using the 1 of 4 encoding of the present invention. Each output signal may comprise an inverting output buffer 34 on the associated wires of the signal. To reduce adding additional capacitance to the device, the preferred embodiment of the present invention uses a single, shared logic tree with multiple evaluation paths for evaluating the function of the logic circuit and for generating the plurality output signals coupled to the logic circuit.

The precharge circuit 31 has a plurality P-FETs to quickly and fully precharge all of the dynamic logic in the logic tree circuit during the precharge phase of the clock cycle with each evaluation path of the logic tree circuit having its own precharge P-FET. Coupled to the precharge circuit 31 is a clock signal CK. When the clock signal is low, the precharge tree circuit 31 precharges the N-FETs in the logic tree circuit 107.

The evaluate circuit 36 has a single evaluation transistor, which aids in the speed of the clocking of the device and helps avoid races between other devices. Other embodiments of the present invention may use multiple evaluation devices. Coupled to the evaluate circuit 36 is the clock signal CK. When the clock signal is high, the evaluate circuit 36 evaluates the logic tree circuit 107.

The maximum stack height of this embodiment of the present invention is 2 transistors. For example, the transistors $B_2$ and $A_2$ reside on one evaluation path. The transistor $A_3$ on an evaluation path is an example of a stack height of 1.

The logic tree circuit 107 of this embodiment of the present invention performs the OR/NOR logic function with the following output table for the OR function:

TABLE 11

| $A_3$ | $A_2$ | $A_1$ | $A_0$ | $B_3$ | $B_2$ | $B_1$ | $B_0$ | $V_3$ | $V_2$ | $V_1$ | $V_0$ |
|---|---|---|---|---|---|---|---|---|---|---|---|
| 0 | 0 | 0 | 0 | 0 | 0 | 0 | 0 | 0 | 0 | 0 | 0 |
| 0 | 0 | 0 | 1 | 0 | 0 | 0 | 1 | 0 | 0 | 0 | 1 |
| 0 | 0 | 0 | 1 | 0 | 0 | 1 | 0 | 0 | 0 | 1 | 0 |
| 0 | 0 | 0 | 1 | 0 | 1 | 0 | 0 | 0 | 1 | 0 | 0 |
| 0 | 0 | 0 | 1 | 1 | 0 | 0 | 0 | 1 | 0 | 0 | 0 |
| 0 | 0 | 1 | 0 | 0 | 0 | 0 | 1 | 0 | 0 | 1 | 0 |
| 0 | 0 | 1 | 0 | 0 | 0 | 1 | 0 | 0 | 0 | 1 | 0 |
| 0 | 0 | 1 | 0 | 0 | 1 | 0 | 0 | 0 | 1 | 0 | 0 |
| 0 | 0 | 1 | 0 | 1 | 0 | 0 | 0 | 1 | 0 | 0 | 0 |
| 0 | 1 | 0 | 0 | 0 | 0 | 0 | 1 | 0 | 1 | 0 | 0 |
| 0 | 1 | 0 | 0 | 0 | 0 | 1 | 0 | 0 | 1 | 0 | 0 |
| 0 | 1 | 0 | 0 | 0 | 1 | 0 | 0 | 0 | 1 | 0 | 0 |
| 0 | 1 | 0 | 0 | 1 | 0 | 0 | 0 | 1 | 0 | 0 | 0 |
| 1 | 0 | 0 | 0 | 0 | 0 | 0 | 1 | 1 | 0 | 0 | 0 |
| 1 | 0 | 0 | 0 | 0 | 0 | 1 | 0 | 1 | 0 | 0 | 0 |

TABLE 11-continued

| $A_3$ | $A_2$ | $A_1$ | $A_0$ | $B_3$ | $B_2$ | $B_1$ | $B_0$ | $V_3$ | $V_2$ | $V_1$ | $V_0$ |
|---|---|---|---|---|---|---|---|---|---|---|---|
| 1 | 0 | 0 | 0 | 0 | 1 | 0 | 0 | 1 | 0 | 0 | 0 |
| 1 | 0 | 0 | 0 | 1 | 0 | 0 | 0 | 1 | 0 | 0 | 0 |

Figure 7:
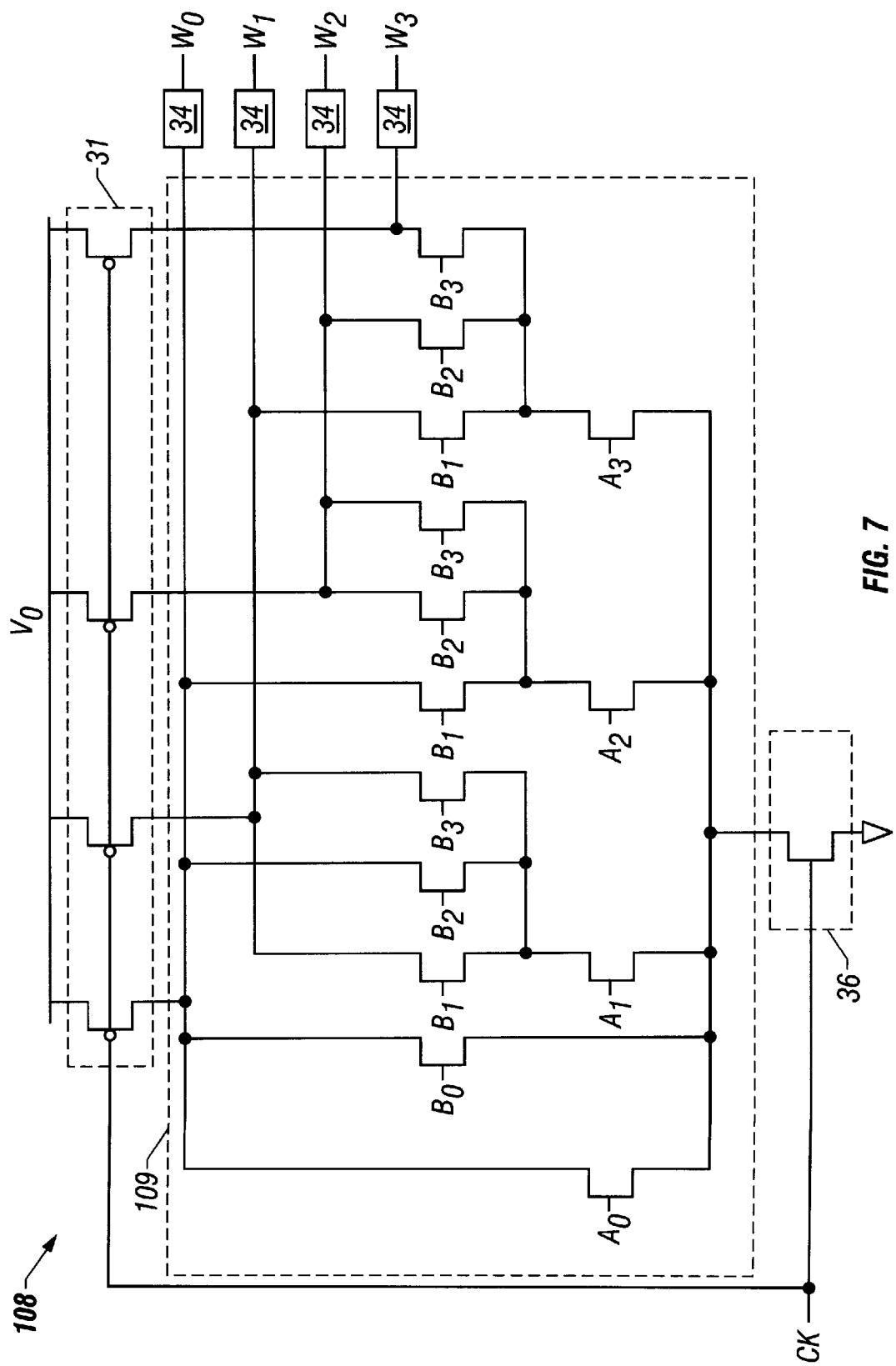
FIG. 7 is a circuit diagram of one embodiment of the present invention for the AND/NAND function for a N-Nary logic circuit with a dit device.

FIG. 7 is a circuit diagram of one embodiment of the present invention for the AND/NAND function using a 1 of 4 signal with 1 of 4 encoding. One skilled in the art will appreciate that one function is the inverse of the other function. A device 108 is a dit (2 bit) device that has two 2 bit inputs and a 2 bit output that comprises a precharge tree circuit 31, an evaluate device 36, and a logic tree circuit 109. A 1 of 4 signal with a plurality of input values $A_0$, $A_1$, $A_2$, and $A_3$ and their associated wires for the first 2 bit input couples to the logic tree circuit 109 using a 1 of 4 encoding of the present invention. A 1 of 4 signal with a plurality of input values $B_0$, $B_1$, $B_2$, and $B_3$ and their associated wires for the second 2 bit input couples to the logic tree circuit 109 using a 1 of 4 encoding of the present invention. A 1 of 4 signal with a plurality of output values $W_0$, $W_1$, $W_2$, and $W_3$ and their associated wires for the 2 bit output couples to the logic tree circuit 109 using the 1 of 4 encoding of the present invention. Each output signal may comprise an inverting output buffer 34 on the associated wires of the signal. The device 108 uses a shared logic tree and shared input signals with separate evaluation paths to generate all of the outputs for the specified function. And, the maximum stack height of this embodiment of the present invention is 2 transistors.

The precharge circuit 31 has a plurality P-FETs to quickly and fully precharge all of the dynamic logic in the logic tree circuit during the precharge phase of the clock cycle with each evaluation path of the logic tree circuit having its own precharge P-FET. Coupled to the precharge circuit 31 is a clock signal CK. When the clock signal is low, the precharge circuit 31 precharges the N-FETs in the logic tree circuit 109.

The evaluate circuit 36 has a single evaluation transistor, which aids in the speed of the clocking of the device and helps avoid races between other devices. Coupled to the evaluate circuit 36 is the clock signal CK. When the clock signal is high, the evaluate circuit 36 evaluates the logic tree circuit 109.

The logic tree circuit 109 of this embodiment of the present invention performs the AND/NAND logic function with the following output table for the AND function:

TABLE 12

| $A_3$ | $A_2$ | $A_1$ | $A_0$ | $B_3$ | $B_2$ | $B_1$ | $B_0$ | $W_3$ | $W_2$ | $W_1$ | $W_0$ |
|---|---|---|---|---|---|---|---|---|---|---|---|
| 0 | 0 | 0 | 0 | 0 | 0 | 0 | 0 | 0 | 0 | 0 | 0 |
| 0 | 0 | 0 | 1 | 0 | 0 | 0 | 1 | 0 | 0 | 0 | 1 |
| 0 | 0 | 0 | 1 | 0 | 0 | 1 | 0 | 0 | 0 | 0 | 1 |
| 0 | 0 | 0 | 1 | 0 | 1 | 0 | 0 | 0 | 0 | 0 | 1 |
| 0 | 0 | 0 | 1 | 1 | 0 | 0 | 0 | 0 | 0 | 0 | 1 |
| 0 | 0 | 1 | 0 | 0 | 0 | 0 | 1 | 0 | 0 | 0 | 1 |
| 0 | 0 | 1 | 0 | 0 | 0 | 1 | 0 | 0 | 0 | 1 | 0 |
| 0 | 0 | 1 | 0 | 0 | 1 | 0 | 0 | 0 | 0 | 0 | 1 |
| 0 | 0 | 1 | 0 | 1 | 0 | 0 | 0 | 0 | 0 | 1 | 0 |
| 0 | 1 | 0 | 0 | 0 | 0 | 0 | 1 | 0 | 0 | 1 | 0 |
| 0 | 1 | 0 | 0 | 0 | 0 | 1 | 0 | 0 | 0 | 0 | 1 |
| 0 | 1 | 0 | 0 | 0 | 1 | 0 | 0 | 0 | 0 | 1 | 0 |
| 0 | 1 | 0 | 0 | 1 | 0 | 0 | 0 | 0 | 1 | 0 | 0 |
| 1 | 0 | 0 | 0 | 0 | 0 | 0 | 1 | 0 | 0 | 0 | 1 |
| 1 | 0 | 0 | 0 | 0 | 0 | 1 | 0 | 0 | 0 | 1 | 0 |

TABLE 12-continued

| $A_3$ | $A_2$ | $A_1$ | $A_0$ | $B_3$ | $B_2$ | $B_1$ | $B_0$ | $W_3$ | $W_2$ | $W_1$ | $W_0$ |
|---|---|---|---|---|---|---|---|---|---|---|---|
| 1 | 0 | 0 | 0 | 0 | 1 | 0 | 0 | 0 | 1 | 0 | 0 |
| 1 | 0 | 0 | 0 | 1 | 0 | 0 | 0 | 1 | 0 | 0 | 0 |

Figure 8:
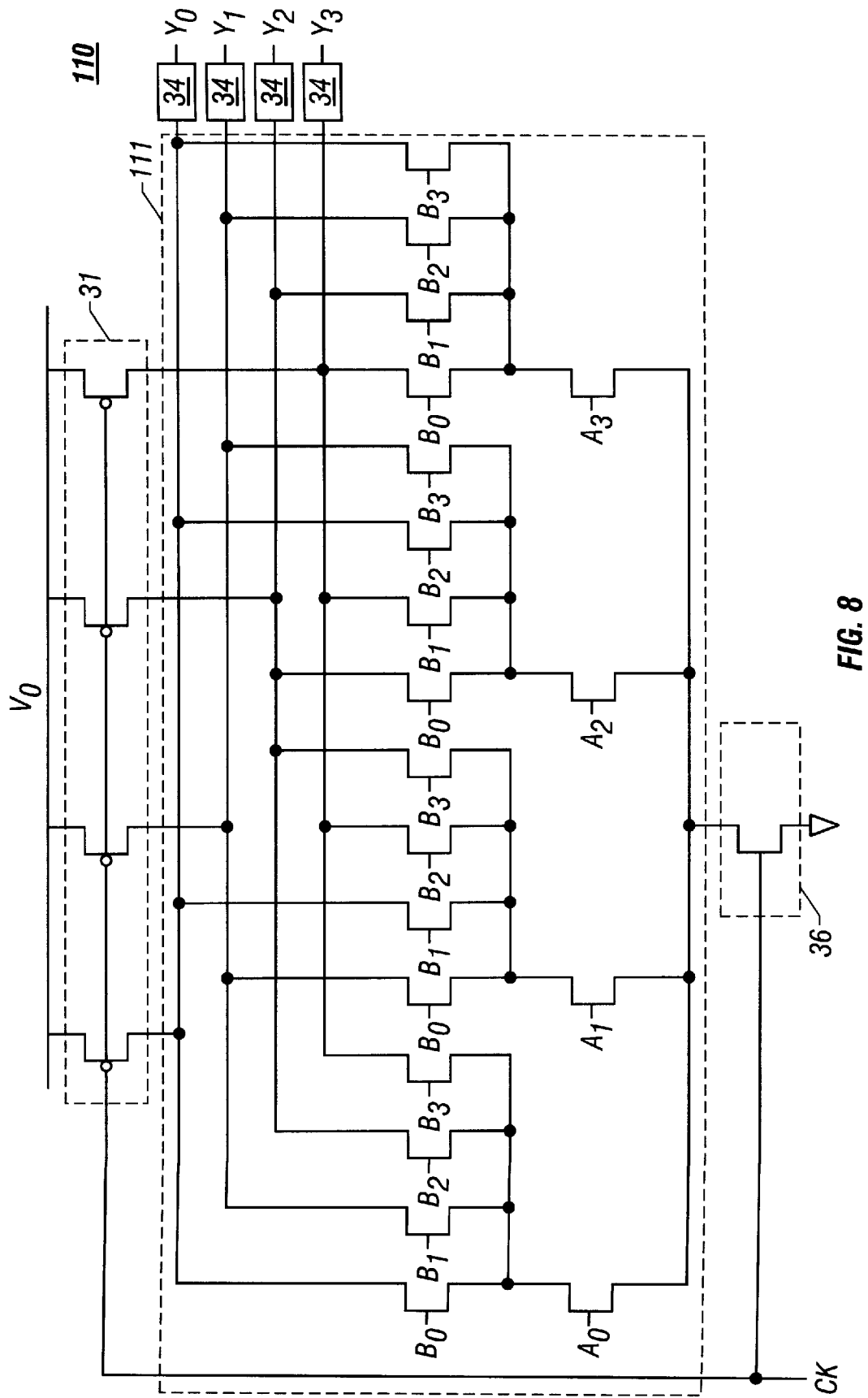
FIG. 8 is a circuit diagram of one embodiment of the present invention for the XOR/Equivalence function for a N-Nary logic circuit with a dit device.

FIG. 8 is a circuit diagram of one embodiment of the present invention for the XOR/Equivalence function using a 1 of 4 encoding. One skilled in the art will appreciate that one function is the inverse of the other function. A device 110 is a dit (2 bit) device that has two 2 bit inputs and a 2 bit output that comprises a precharge circuit 31, an evaluate circuit 36, and a logic tree circuit 111. A 1 of 4 signal with a plurality of input values $A_0$, $A_1$, $A_2$, and $A_3$ and their associated wires for the first 2 bit input couples to the logic tree circuit 107 using a 1 of 4 encoding of the present invention. A 1 of 4 signal with a plurality of input values $B_0$, $B_1$, $B_2$, and $B_3$ and their associated wires for the second 2 bit input couples to the logic tree circuit 111 using a 1 of 4 encoding of the present invention. A 1 of 4 signal with a plurality of output values $Y_0$, $Y_1$, $Y_2$, and $Y_3$ and their associated wires for the 2 bit output couples to the logic tree circuit 111 using the 1 of 4 encoding of the present invention. Each output signal may comprise an inverting output buffer 34 on the associated wire of the signal. The device 110 uses a shared logic tree and shared input signals with separate evaluation paths to generate all of the outputs for the specified function. And, the maximum stack height of this embodiment of the present invention is 2 transistors.

The precharge circuit 31 has a plurality P-FETs to quickly and fully precharge all of the dynamic logic in the logic tree circuit during the precharge phase of the clock cycle with each evaluation path of the logic tree circuit having its own precharge P-FET. Coupled to the precharge circuit 31 is a clock signal CK. When the clock signal is low, the precharge circuit 31 precharges the N-FETs in the logic tree circuit 111.

The evaluate circuit 36 has a single evaluation transistor, which aids in the speed of the clocking of the device and helps avoid races between other devices. Coupled to the evaluate circuit 36 is the clock signal CK. When the clock signal is high, the evaluate circuit 36 evaluates the logic tree circuit 111.

The logic tree circuit 111 of this embodiment of the present invention performs the XOR/Equivalence logic function with the following output table for the XOR function:

TABLE 13

| $A_3$ | $A_2$ | $A_1$ | $A_0$ | $B_3$ | $B_2$ | $B_1$ | $B_0$ | $Y_3$ | $Y_2$ | $Y_1$ | $Y_0$ |
|---|---|---|---|---|---|---|---|---|---|---|---|
| 0 | 0 | 0 | 0 | 0 | 0 | 0 | 0 | 0 | 0 | 0 | 0 |
| 0 | 0 | 0 | 1 | 0 | 0 | 0 | 1 | 0 | 0 | 0 | 1 |
| 0 | 0 | 0 | 1 | 0 | 0 | 1 | 0 | 0 | 0 | 1 | 0 |
| 0 | 0 | 0 | 1 | 0 | 1 | 0 | 0 | 0 | 1 | 0 | 0 |
| 0 | 0 | 0 | 1 | 1 | 0 | 0 | 0 | 1 | 0 | 0 | 0 |
| 0 | 0 | 1 | 0 | 0 | 0 | 0 | 1 | 0 | 0 | 1 | 0 |
| 0 | 0 | 1 | 0 | 0 | 0 | 1 | 0 | 0 | 0 | 0 | 1 |
| 0 | 0 | 1 | 0 | 0 | 1 | 0 | 0 | 1 | 0 | 0 | 0 |
| 0 | 0 | 1 | 0 | 1 | 0 | 0 | 0 | 0 | 1 | 0 | 0 |
| 0 | 1 | 0 | 0 | 0 | 0 | 0 | 1 | 0 | 1 | 0 | 0 |
| 0 | 1 | 0 | 0 | 0 | 0 | 1 | 0 | 1 | 0 | 0 | 0 |
| 0 | 1 | 0 | 0 | 0 | 1 | 0 | 0 | 0 | 0 | 0 | 1 |
| 0 | 1 | 0 | 0 | 1 | 0 | 0 | 0 | 0 | 0 | 1 | 0 |
| 1 | 0 | 0 | 0 | 0 | 0 | 0 | 1 | 1 | 0 | 0 | 0 |
| 1 | 0 | 0 | 0 | 0 | 1 | 0 | 0 | 0 | 0 | 1 | 0 |

TABLE 13-continued

| $A_3$ | $A_2$ | $A_1$ | $A_0$ | $B_3$ | $B_2$ | $B_1$ | $B_0$ | $Y_3$ | $Y_2$ | $Y_1$ | $Y_0$ |
|---|---|---|---|---|---|---|---|---|---|---|---|
| 1 | 0 | 0 | 0 | 0 | 1 | 0 | 0 | 0 | 0 | 1 | 0 |
| 1 | 0 | 0 | 0 | 1 | 0 | 0 | 0 | 0 | 0 | 0 | 1 |

Figure 9:
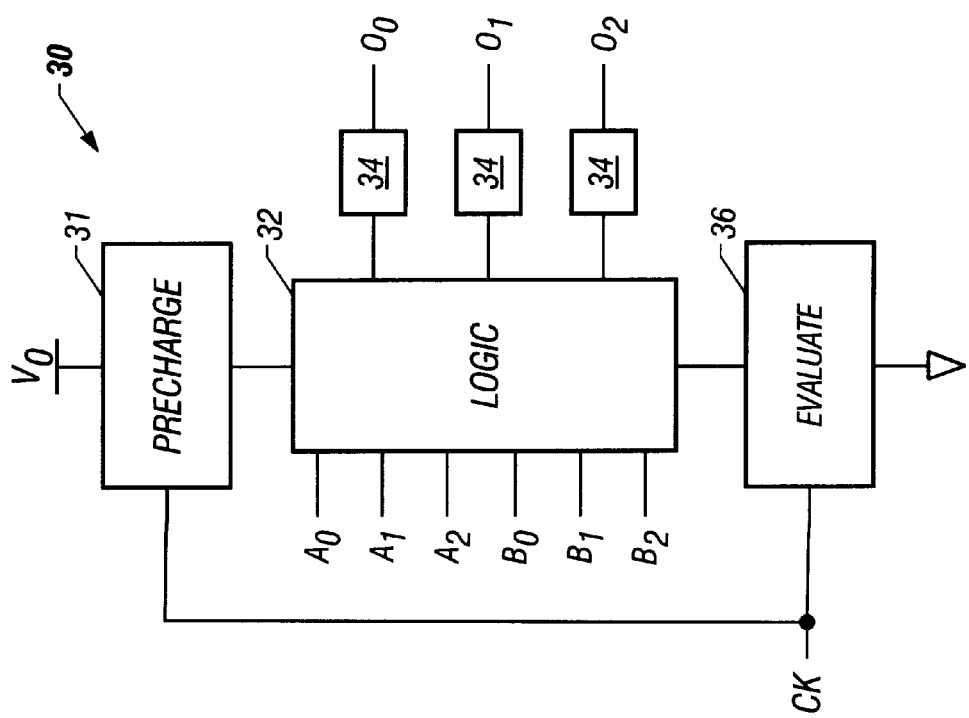
FIG. 9 is a block diagram of an embodiment of an N-nary logic circuit of the present invention using 1 of 3 signals.

FIG. 9 illustrates one embodiment of the present invention using two sets of 1 of 3 signals for the input signals and a 1 of 3 signal for the output signal with all 1 of 3 signals using 1 of 3 encoding. This embodiment of the present invention describes a 2 bit logic gate where a is a 2 bit input, b is a 2 bit input, and o is a 2 bit output. We know from the design of this logic gate that the output function does not require all of the possible values in the truth table that are available in a 1 of 4 encoding. The reduction in possible values also allows us to use fewer wires in the circuit. Referring to FIG. 9, a device 30 comprises a logic tree circuit 32, a precharge circuit 31, and an evaluate device 36. Coupled to the logic tree circuit is the 2 bit input a that comprises a 1 of 3 signal with a plurality of input values $A_0$, $A_1$, and $A_2$ and their associated wires using a 1 of 3 encoding. Additionally coupled to the logic tree circuit is the 2 bit input b that comprises a 1 of 3 signal with a plurality of input values $B_0$, $B_1$, and $B_2$ and their associated wires using a 1 of 3 encoding. And, coupled to the logic tree circuit is the 2 bit output o that comprises a 1 of 3 signal with a plurality of output values $O_0$, $O_1$, and $O_2$ using a 1 of 3 encoding. The logic tree circuit 32 performs a logic function on a plurality of input signals that could comprise a variety of functions, for example, the Boolean logic functions AND/NAND, OR/NOR, or XOR/Equivalence. The logic tree circuit 32 comprises one or more FETs with the preferred embodiment of the logic tree circuit comprising N-channel FETs.

Coupled to the wires of the 1 of 3 output signal are the output buffers 34 that aid in driving additional circuits that couple to the output signal. The preferred embodiment of the present invention uses an output buffer with an inverting function as the output buffer 34. Another embodiment of the present invention comprises a non-inverting buffer as the output buffer. And, another embodiment of the present invention does not use an output buffer, instead, the plurality of output signal couples directly to other circuits.

A precharge circuit 31 couples to the logic tree circuit 61 and precharges the dynamic logic of the logic tree circuit. The precharge circuit 31 has a plurality P-FETs to quickly and fully precharge all of the dynamic logic in the logic tree circuit during the precharge phase of the clock cycle with each evaluation path of the logic tree circuit having its own precharge P-FET. Coupled to the precharge circuit 31 is the clock signal CK. A low clock signal on CK will cause the FETs in the logic tree circuit 32 to charge when using P-channel FETs in the precharge circuit.

An evaluate circuit 36 couples to the logic tree circuit and controls the evaluation of the logic tree circuit. The evaluate circuit 36 comprises one or more FETs with the preferred embodiment of the circuit comprising a single N-channel FET. Coupled to the evaluate circuit 36 is the clock signal CK. A high clock signal on CK will cause the FETs in the logic tree circuit 32 to evaluate when using N-channel FETs in the evaluate circuit.

Figure 10:
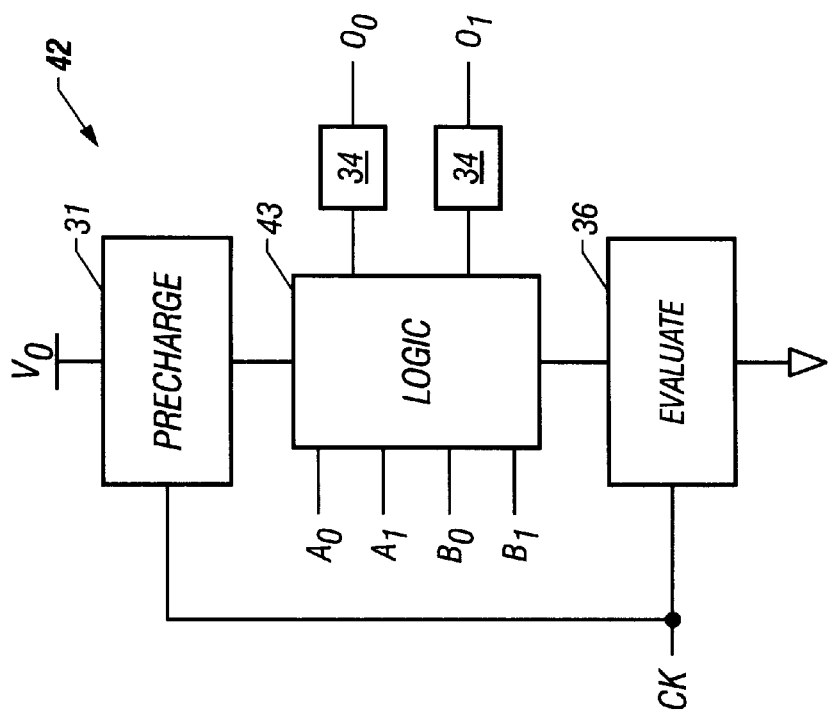
FIG. 10 is a block diagram of one embodiment of the present invention for a two bit input using 1 of 2 signals.

FIG. 10 illustrates one embodiment of the present invention using two sets of 1 of 2 signals for the input signals and a 1 of 2 signal for the output signals all using 1 of 2 encoding. A device 42 comprises a precharge circuit 31, an evaluate circuit 36, and a logic tree circuit 43. The logic tree circuit 43 performs a logic function on the input signals. The logic function could comprise a variety of logic functions including Boolean logic functions such as AND/NAND, OR/NOR, or XOR/Equivalence. The device 42 is a two bit input (a and b) device with a one bit output (o). The two bit input comprises two sets of 1 of 2 signals each with a plurality of input values using 1 of 2 encoding, $A_0$ and $A_1$, and $B_0$ and $B_1$. The plurality of input signals couple to the logic tree circuit 43. And, coupled to the logic tree circuit is a 1 of 2 signal with a plurality of output values $O_0$ and $O_1$. Each wire of the output 1 of 2 signal may comprise an inverting output buffer 34 on the wire.

If the function of the logic tree circuit 43 is a Boolean OR function, then the logic table for the device 42 is the following:

TABLE 12

| a | b | o | $A_0$ | $A_1$ | $B_0$ | $B_1$ | $O_0$ | $O_1$ |
|---|---|---|---|---|---|---|---|---|
| 0 | 0 | 0 | 0 | 0 | 0 | 0 | 0 | 0 |
| 0 | 0 | 0 | 0 | 1 | 0 | 1 | 0 | 1 |
| 0 | 1 | 1 | 0 | 1 | 1 | 0 | 0 | 1 |
| 1 | 0 | 1 | 1 | 0 | 0 | 1 | 1 | 0 |
| 1 | 1 | 1 | 1 | 0 | 1 | 0 | 1 | 0 |

Figure 11:
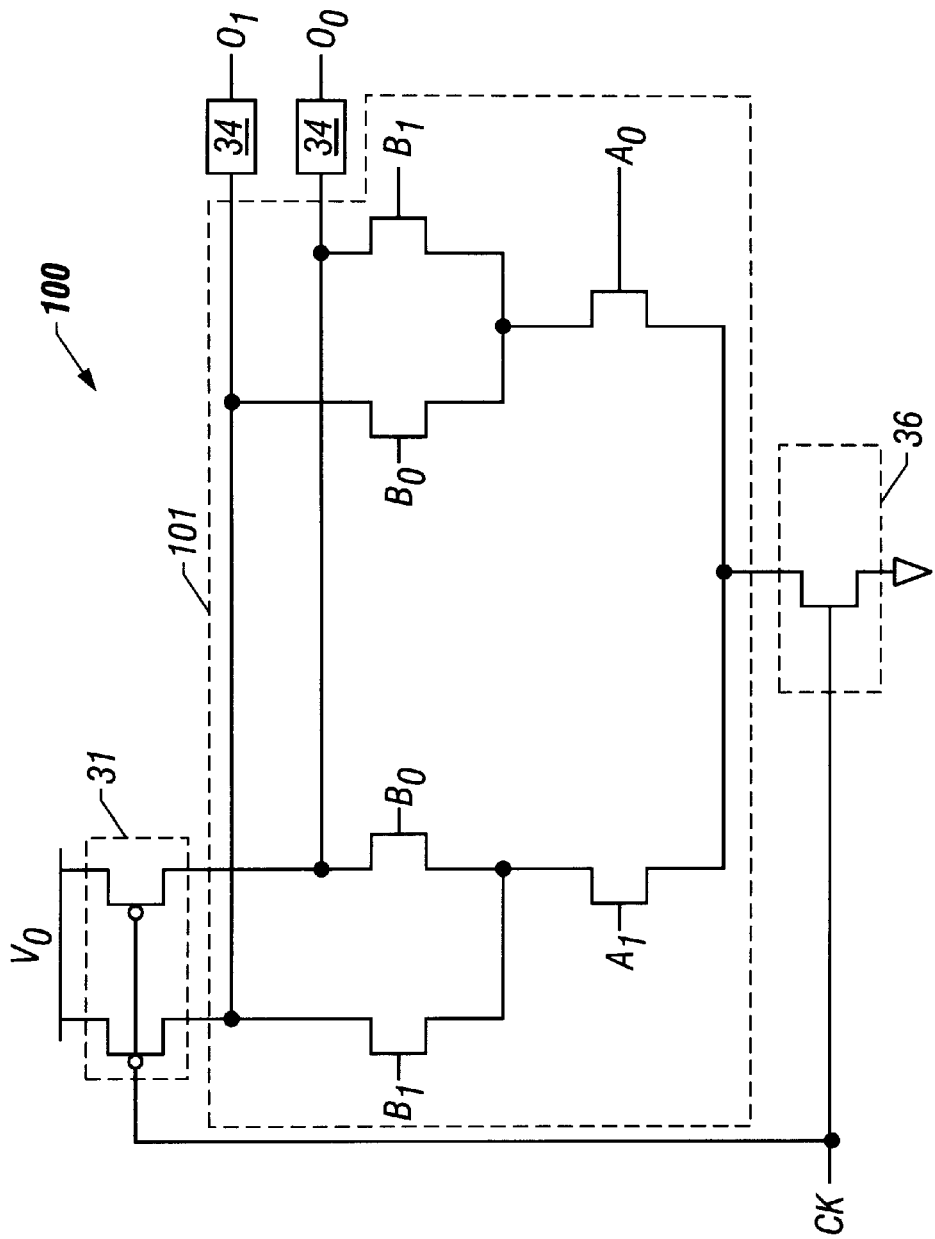
FIG. 11 is a circuit diagram of one embodiment of the present invention for the XOR/Equivalence function for a device using 1 of 2 signals.

FIG. 11 is a circuit diagram of one embodiment of the present invention for the XOR/Equivalence function using a 1 of 2 encoding. One skilled in the art will appreciate that one function is the inverse of the other function. A device 100 is a 2 bit input and 1 bit output device that comprises a precharge circuit 31, an evaluate circuit 36, and a logic tree circuit 101. The device 100 comprises multiple signals using 1 of 2 signals using 1 of 2 encoding. One 1 of 2 signal (that corresponds to 1 bit) comprises a plurality of input values $A_0$ and $A_1$ with its associated wires that couples to the logic tree circuit 101, and the 1 of 2 signal (that corresponds to the other 1 bit input) that comprises a plurality of input values $B_0$ and $B_1$ and its associated wires that also couples to the logic tree circuit 101. Additionally, a 1 of 2 output signal with plurality of output values $O_0$ and $O_1$ and its associated wires couples to the logic tree circuit 101 using the 1 of 2 encoding of the present invention. Each wire of the output signal may comprise an inverting output buffer 34 on the associated wire. The preferred embodiment of the present invention uses a single, shared logic tree with multiple evaluation paths for evaluating the function of the logic circuit and for generating the plurality output signals coupled to the logic circuit.

The precharge circuit 31 has a plurality of P-FETs to quickly and fully precharge all of the dynamic logic in the logic tree circuit during the precharge phase of the clock cycle with each evaluation path of the logic tree circuit having its own precharge P-FET. Coupled to the precharge tree circuit 31 is a clock signal CK. When the clock signal is low, the precharge circuit 31 precharges the N-FETs in the logic tree circuit 101.

The evaluate circuit 36 has a single evaluation transistor, which aids in the speed of the clocking of the device and helps avoid races between other devices. Other embodiments of the present invention may use multiple evaluation devices. Coupled to the evaluate circuit 36 is the clock signal CK. When the clock signal is high, the evaluate circuit 36 evaluates the logic tree circuit 101.

The logic tree circuit 101 of this embodiment of the present invention performs the XOR/Equivalence logic function with the following output table for the XOR function:

TABLE 13

| $A_0$ | $A_1$ | $B_0$ | $B_1$ | $O_0$ | $O_1$ |
|---|---|---|---|---|---|
| 0 | 0 | 0 | 0 | 0 | 0 |
| 0 | 1 | 0 | 1 | 1 | 0 |
| 0 | 1 | 1 | 0 | 0 | 1 |
| 1 | 0 | 0 | 1 | 0 | 1 |
| 1 | 0 | 1 | 0 | 1 | 0 |

Figure 12:
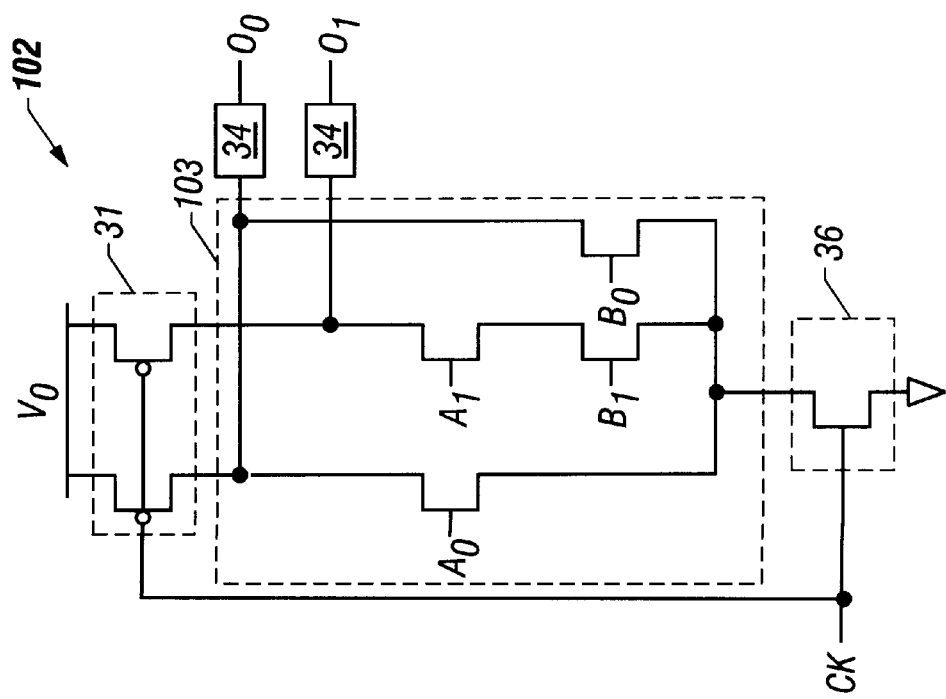
FIG. 12 is a circuit diagram of one embodiment of the present invention for the OR/NOR function for a device using 1 of 2 signals.

FIG. 12 is a circuit diagram of one embodiment of the present invention for the OR/NOR function using 1 of 2 signals with 1 of 2 encoding. One skilled in the art will appreciate that one function is the inverse of the other function. A device 102 is a 2 bit input and 1 bit output device that comprises a precharge circuit 31, an evaluate circuit 36, and a logic tree circuit 103. A 1 of 2 signal with a plurality of input values $A_0$, $A_1$ and a 1 of 2 signal with a plurality of input values $B_0$ and $B_1$ couples to the logic tree circuit 103 using a 1 of 2 encoding of the present invention. A 1 of 2 signal with a plurality of output values $O_0$ and $O_1$ couples to the logic tree circuit 103 using the 1 of 2 encoding of the present invention. Each wire of the output signal may comprise an inverting output buffer 34 on the associated wire. The device 102 uses a single shared logic tree and shared input signals with separate evaluation paths to generate all of the outputs for the specified function.

The precharge circuit 31 has a plurality of P-FETs to quickly and fully precharge all of the dynamic logic in the logic tree circuit during the precharge phase of the clock cycle with each evaluation path of the logic tree circuit having its own precharge P-FET. Coupled to the precharge circuit 31 is a clock signal CK. When the clock signal is low, the precharge circuit 31 precharges the N-FETs in the logic tree circuit 103.

The evaluate circuit 36 has a single evaluation transistor, which aids in the speed of the clocking of the device and helps avoid races between other devices. Coupled to the evaluate circuit 36 is the clock signal CK. When the clock signal is high, the evaluate circuit 36 evaluates the logic tree circuit 103.

The logic tree circuit 103 of this embodiment of the present invention performs the OR/NOR logic function with the following output table for the OR function:

TABLE 16

| $A_0$ | $A_1$ | $B_0$ | $B_1$ | $O_0$ | $O_1$ |
|---|---|---|---|---|---|
| 0 | 0 | 0 | 0 | 0 | 0 |
| 0 | 1 | 0 | 1 | 0 | 1 |
| 0 | 1 | 1 | 0 | 1 | 0 |
| 1 | 0 | 0 | 1 | 1 | 0 |
| 1 | 0 | 1 | 0 | 1 | 0 |

Figure 13:
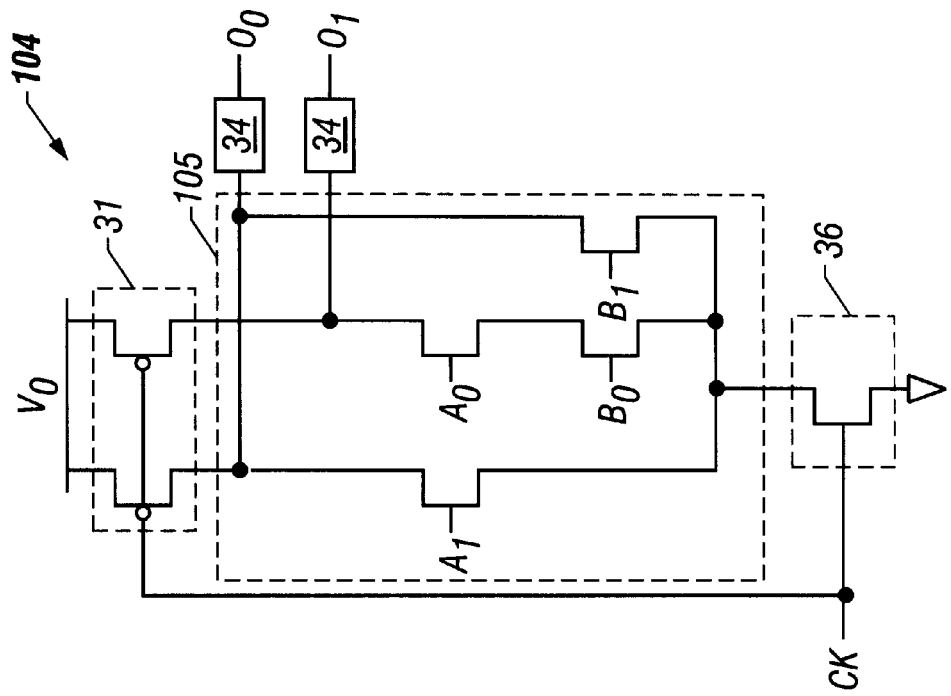
FIG. 13 is a circuit diagram of one embodiment of the present invention for the AND/NAND function for a device using 1 of 2 signals.

FIG. 13 is a circuit diagram of one embodiment of the present invention for the AND/NAND function using a 1 of 2 signal with a 1 of 2 encoding. One skilled in the art will appreciate that one function is the inverse of the other function. A device 104 is a 2 bit input and 1 bit output device that comprises a precharge circuit 31, an evaluate circuit 36, and a logic tree circuit 105. A 1 of 2 signal with a plurality of input values $A_0$, $A_1$ and a 1 of 2 signal with a plurality of input values $B_0$ and $B_1$ couple to the logic tree circuit 105 using a 1 of 2 encoding of the present invention. A 1 of 2 signal with a plurality of output values $O_0$ and $O_1$ couples to the logic tree circuit 105 using the 1 of 2 encoding of the present invention. Each wire of the output signal may comprise an inverting output buffer 34 on the associated wire. The device 104 uses a single shared logic tree and shared input signals with separate evaluation paths to generate all of the outputs for the specified function.

The precharge circuit 31 has a plurality of P-FETs to quickly and fully precharge all of the dynamic logic in the logic tree circuit during the precharge phase of the clock cycle with each evaluation path of the logic tree circuit having its own precharge P-FET. Coupled to the precharge circuit 31 is a clock signal CK. When the clock signal is low, the precharge circuit 31 precharges the N-FETs in the logic tree circuit 105.

The evaluate circuit 36 has a single evaluation transistor, which aids in the speed of the clocking of the device and helps avoid races between other devices. Coupled to the evaluate circuit 36 is the clock signal CK. When the clock signal is high, the evaluate circuit 36 evaluates the logic tree circuit 105.

The logic tree circuit 105 of this embodiment of the present invention performs the AND/NAND logic function with the following output table for the AND function:

TABLE 17

| $A_0$ | $A_1$ | $B_0$ | $B_1$ | $O_0$ | $O_1$ |
|---|---|---|---|---|---|
| 0 | 0 | 0 | 0 | 0 | 0 |
| 0 | 1 | 0 | 1 | 0 | 1 |
| 0 | 1 | 1 | 0 | 0 | 1 |
| 1 | 0 | 0 | 1 | 0 | 1 |
| 1 | 0 | 1 | 0 | 1 | 0 |

Figure 14:
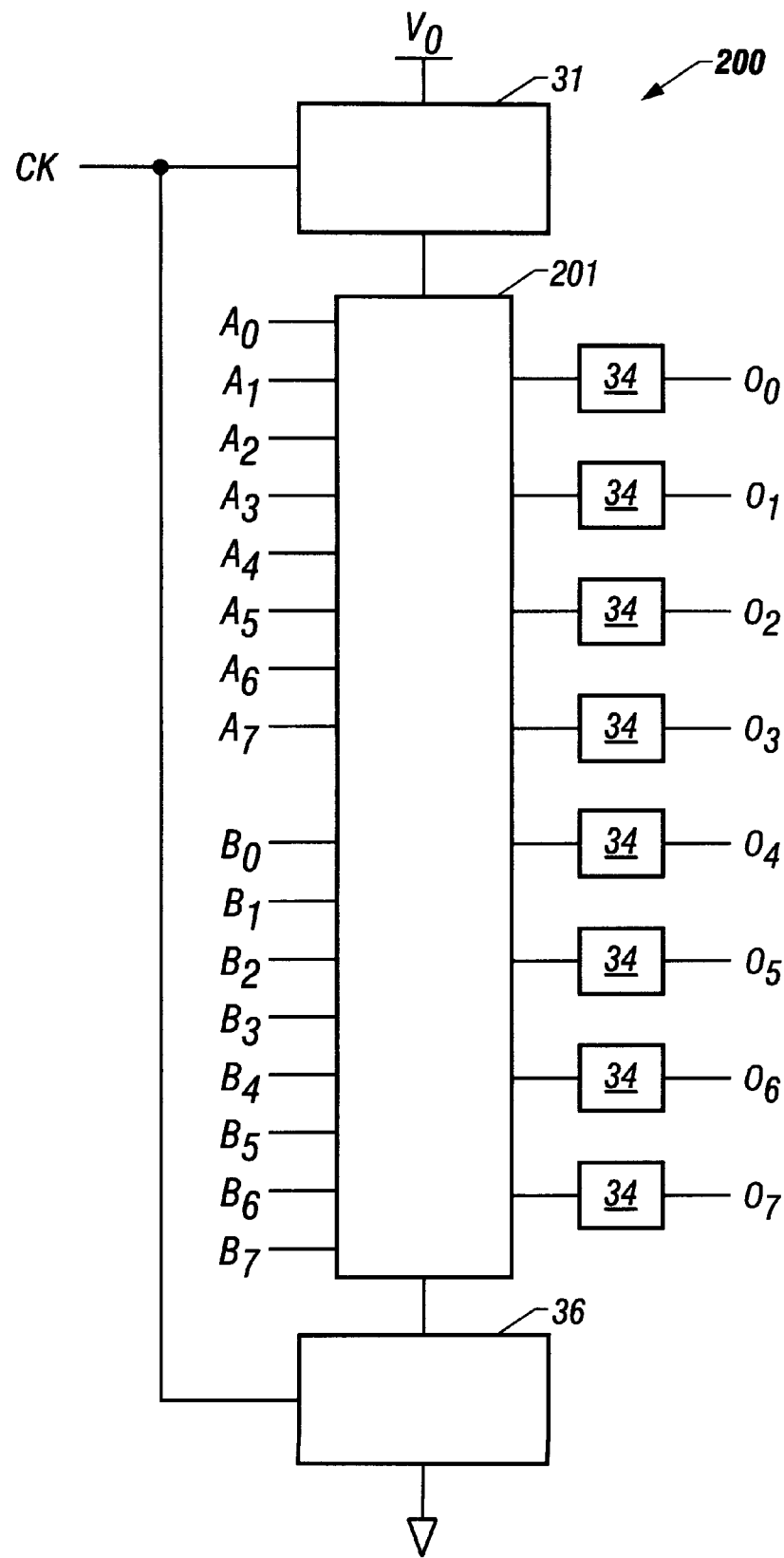
FIG. 14 is a block diagram of an embodiment of an N-nary logic circuit of the present invention using 1 of 8 signals.

FIG. 14 illustrates one embodiment of the present invention using two sets of 1 of 8 signals for the input signals and a 1 of 8 signal for the output signal with all signals using 1 of 8 encoding. This embodiment of the present invention describes a 8 wire logic gate where a is a 1 of 8 input signal, b is a 1 of 8 input signal, and o is a 1 of 8 output signal. Referring to FIG. 14, a device 200 comprises a logic tree circuit 201, a precharge circuit 31, and an evaluate circuit 36. Coupled to the logic tree circuit is the 1 of 8 signal a that comprises a plurality of input values $A_0, A_2, A_3, A_4, A_5, A_6$, and $A_7$ and their associated wires using a 1 of 8 encoding. Additionally coupled to the logic tree circuit is the 1 of 8 signal b that comprises a plurality of input values $B_0, B_1, B_2, B_3, B_4, B_5, B_6$, and $B_7$ and their associated wires using a 1 of 8 encoding. And, coupled to the logic tree circuit is the 1 of 8 output signal o that comprises a plurality of output values $O_0, O_1, O_2, O_3, O_4, O_5, O_6$, and $O_7$ using a 1 of 8 encoding. The logic tree circuit 201 performs a logic function on a plurality of input signals that could comprise a variety of functions, for example, the Boolean logic functions AND/NAND, OR/NOR, or XOR/Equivalence. The logic tree circuit 201 comprises one or more FETs with the preferred embodiment of the logic tree circuit comprising N-channel FETs.

Coupled to the wires of the plurality of output signals are the output buffers 34 that aid in driving additional circuits that couple to the individual wires of the output signal. The preferred embodiment of the present invention uses an output buffer with an inverting function as the output buffer 34. Another embodiment of the present invention comprises a non-inverting buffer as the output buffer. And, another embodiment of the present invention does not use an output buffer, instead, the output signal couples directly to other circuits.

A precharge circuit 31 couples to the logic tree circuit 61 and precharges the dynamic logic of the logic tree circuit. The precharge circuit 31 has a plurality P-FETs to quickly and fully precharge all of the dynamic logic in the logic tree circuit during the precharge phase of the clock cycle with each evaluation path of the logic tree circuit having its own precharge P-FET. Coupled to the precharge circuit 31 is the clock signal CK. A low clock signal on CK will cause the FETs in the logic tree circuit 32 to charge when using P-channel FETs in the precharge circuit.

An evaluate circuit 36 couples to the logic tree circuit and controls the evaluation of the logic tree circuit. The evaluate circuit 36 comprises one or more FETs with the preferred embodiment of the circuit comprising a single N-channel FET. Coupled to the evaluate circuit 36 is the clock signal CK. A high clock signal on CK will cause the FETs in the logic tree circuit 32 to evaluate when using N-channel FETs in the evaluate circuit.

Figure 15:
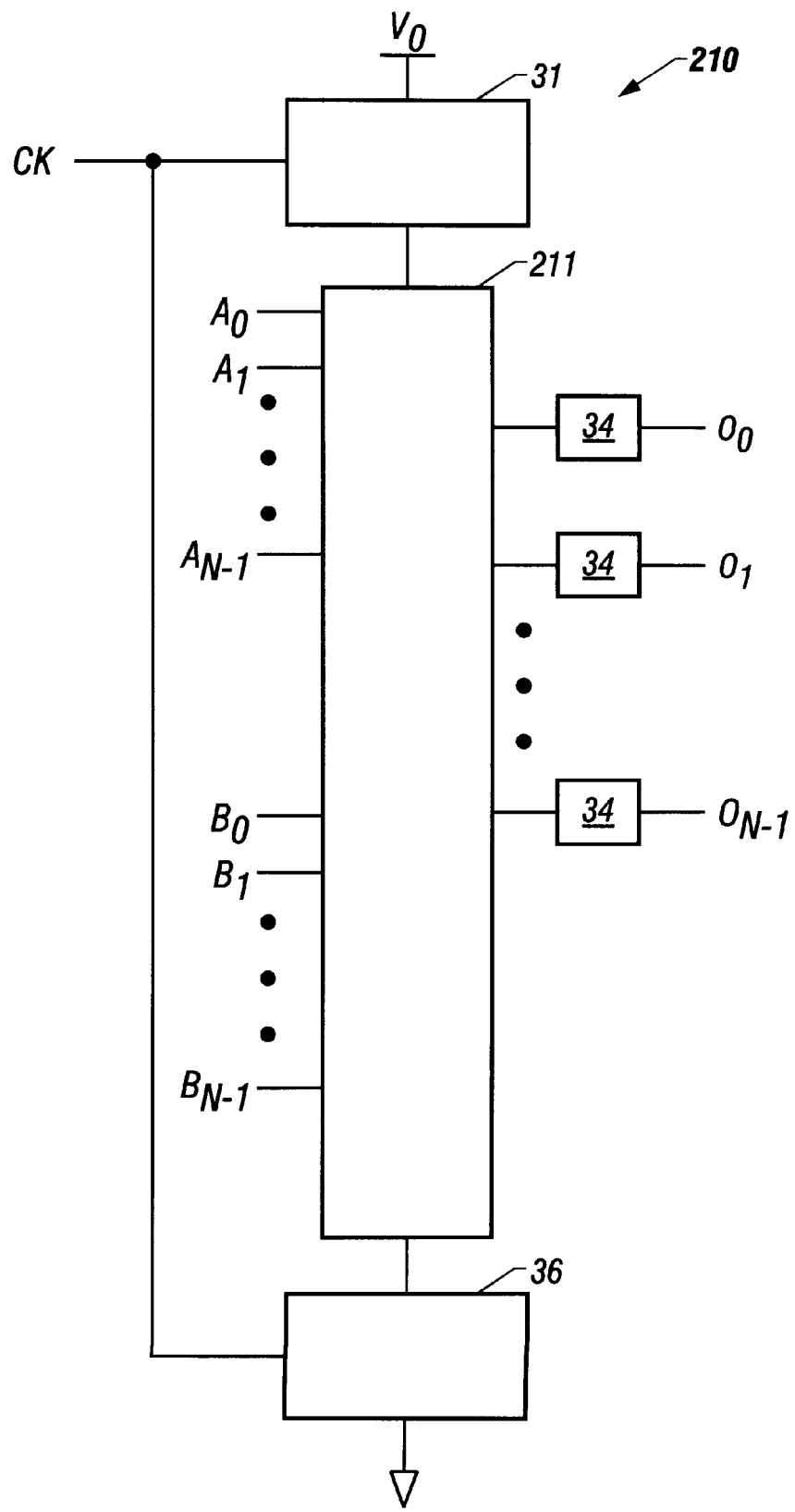
FIG. 15 is a block diagram of an embodiment of an N-nary logic circuit of the present invention using 1 of N signals.

FIG. 15 illustrates the present invention that comprises a method and apparatus for an N-Nary logic circuit using a 1 of N encoding. An embodiment of the present invention generally comprises a device 210 that further comprises a logic tree circuit 211, a precharge circuit 31, and an evaluate circuit 36. Coupled to the logic tree circuit is the 1 of N input signal a that comprises a plurality of input values $A_0$ through $A_{N-1}$ and their associated wires using a 1 of N encoding. Additionally coupled to the logic tree circuit is the 1 of N input signal b that comprises a plurality of input values $B_0$ through $B_{N-1}$, and their associated wires using a 1 of N encoding. And, coupled to the logic tree circuit is the 1 of N output signal o that comprises a plurality of output values $O_0$ through $O_{N-1}$ using a 1 of N encoding. Some embodiments of the present invention provide for all of the signals to be of the same type of 1 of N signal, while other embodiments provide for mixing different types of 1 of N signals. The logic tree circuit 211 performs a logic function on a plurality of input signals that could comprise a variety of functions, for example, the Boolean logic functions AND/NAND, OR/NOR, or XOR/Equivalence.

Figure 16:
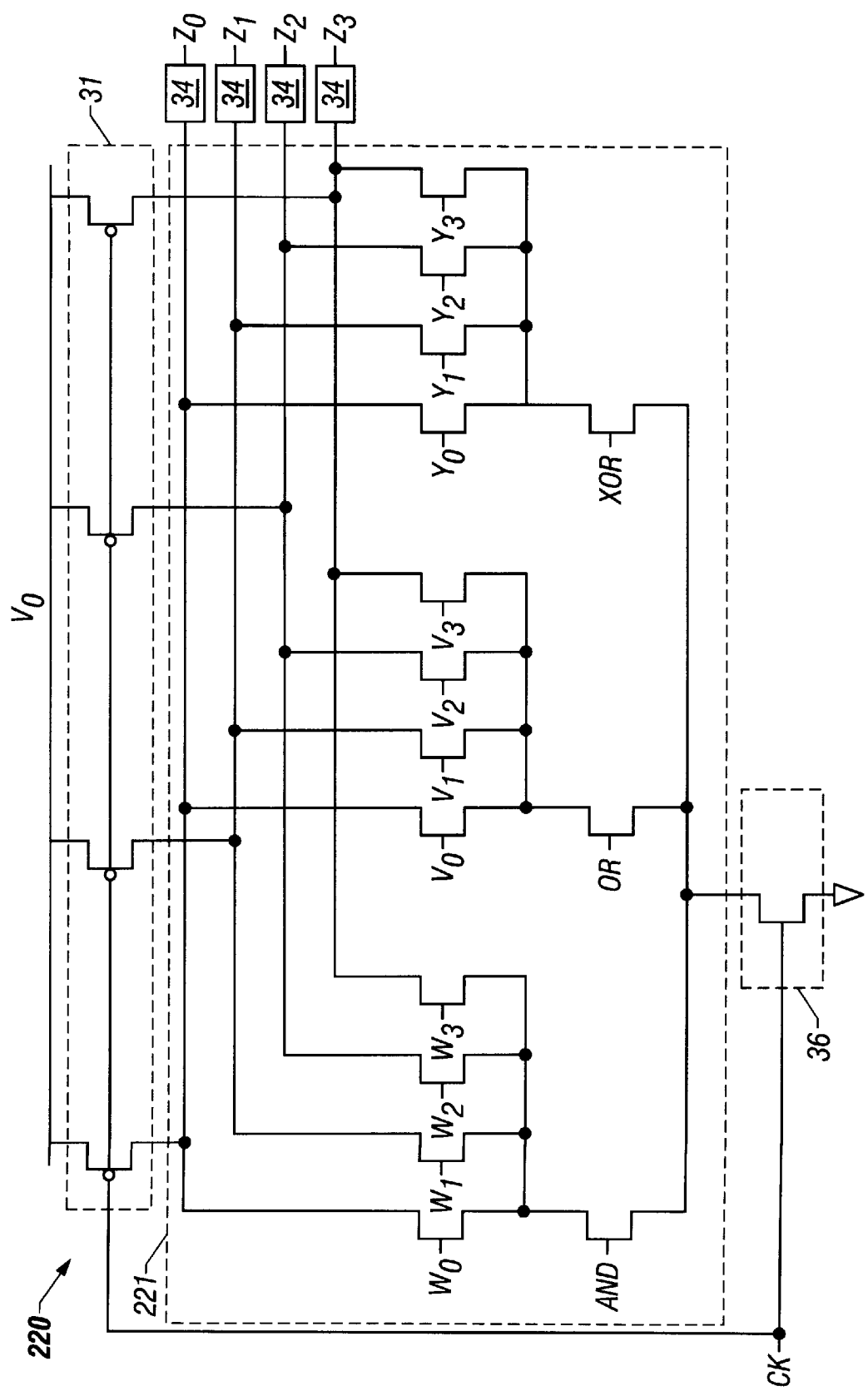
FIG. 16 is a circuit diagram of an embodiment of the present invention for multiple functions selected with a MUX.

FIG. 16 is a circuit diagram of an embodiment of the present invention for multiple functions selected with a MUX, for example, a 3:1 dit MUX using N-nary logic. This embodiment of the present invention uses AND, OR, and XOR as its functions, although the present invention may use other functions as well. A device 220 comprises a precharge circuit 31, a logic tree circuit 221, and an evaluate circuit 36. The precharge circuit and the evaluate circuit operate as previously described. This device uses discrete gates to compute each function separately, and then uses a MUX to select the desired function. Each gate in the first level of device 220 takes two 1 of 4 signals corresponding to input signals a and b as inputs, and produces a 1 of 4 output signal representing its particular function of those inputs. Referring to FIG. 16, the first level gates that produce the 1 of 4 signal with the plurality of values $V_0, V_1, V_2$, and $V_3$ could be the OR gate of FIG. 6, the first level gates that produce the 1 of 4 signal with the plurality of values $W_0, W_1, W_2$, and $W_3$ could be the AND gate of FIG. 7, and the first level gates that produce the 1 of 4 signal with the plurality of signals $Y_0, Y_1, Y_2$, and $Y_3$ could be the XOR gate of FIG. 8. The second level of the MUX device 220 uses the above three 1 of 4 function results computed in the first level as input signals to the MUX select device. To select a particular function, logic tree circuit 221 uses the 1 of 3 input signals with a plurality values AND, OR, and XOR to select the respective and named function AND, OR, and XOR. The output of device 220 is the 1 of 4 output signal with a plurality of values $Z_0, Z_1, Z_2$, and $Z_3$.

Figure 17A:
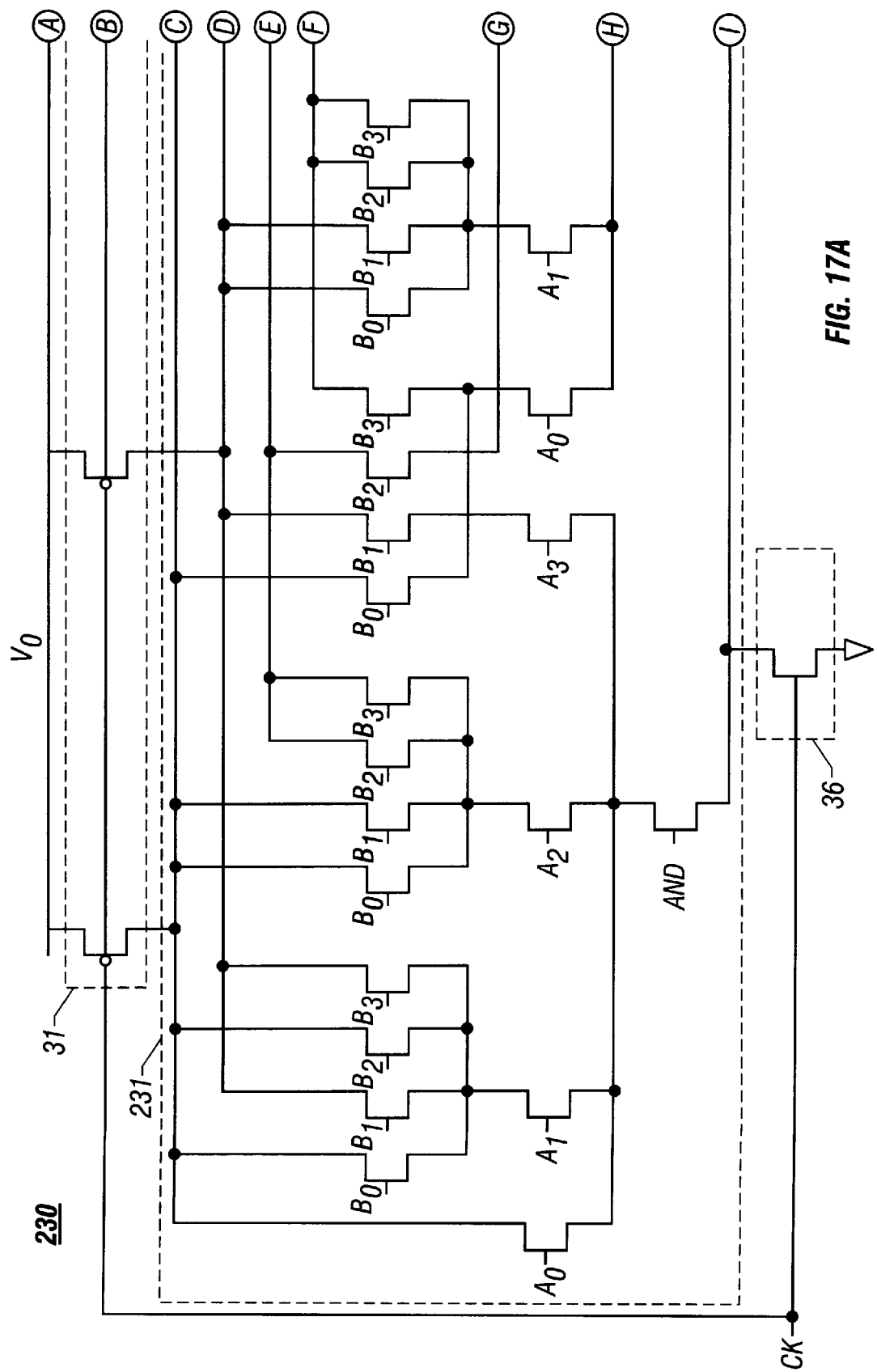
FIG. 17 is a circuit diagram of an embodiment of the present invention for multiple functions selected with a MUX using a single gate for the functions.
Figure 17B:
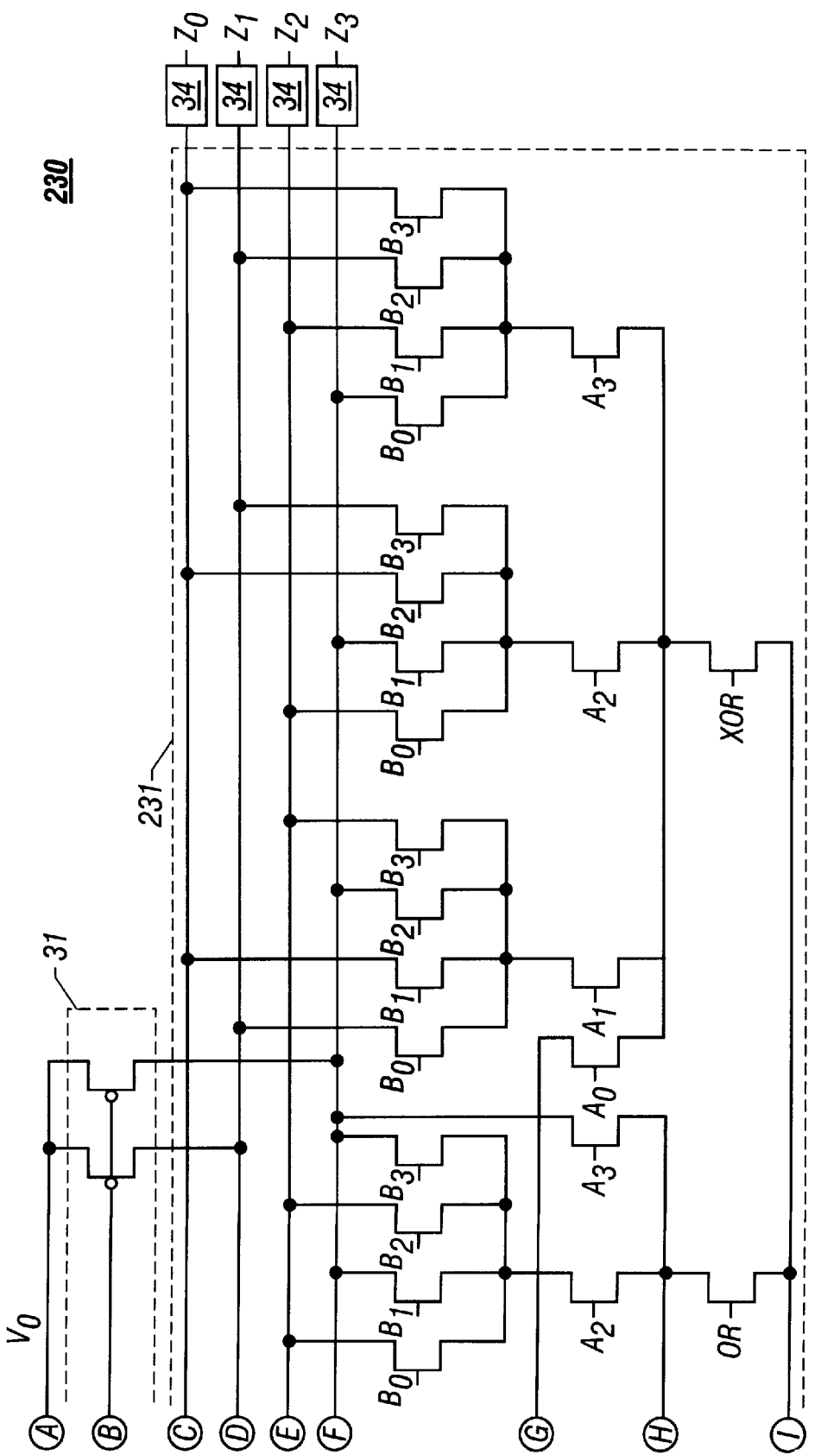

FIG. 17 is a circuit diagram of an embodiment of the present invention for multiple functions selected with a MUX using a single gate for the functions. This embodiment of the present invention uses AND, OR, and XOR as its functions, although the present invention may use other functions as well. A device 230 comprises a precharge circuit 31, a logic tree circuit 231, and an evaluate circuit 36. The precharge circuit and the evaluate circuit operate as previously described. This device performs the same functionality as the device in FIG. 16, however, this device is more efficient than the device in FIG. 16 because it leverages the fact that certain combinations of inputs and outputs produce the same results for several of the functions (for example, AND with 3, OR with 0, and XOR with 0). This allows us to share nodes in the evaluate tree, which reduces the overall transistor count. Another efficiency is that the MUXed selection of the function to perform is part of the actual gate itself instead of in separate devices as in FIG. 16. This eliminates the need for a MUX in a separate level, which also considerably reduces the output driver requirements since no intermediate outputs are produced. This design requires a stack height of three versus the two of the previous example, which suggests that this gate will take a little longer to evaluate than the individual gates of the previous example.

The present invention is a method and apparatus for a two bit logic circuit that uses 1 of 4 signals with 1 of 4 encoding where one and only one of the four logic paths is active during an evaluation cycle. The present invention comprises a logic tree circuit that couples to a first 1 of 4 input signal with a set of logic paths, a second 1 of 4 input signal with a set of logic paths, and a 1 of 4 output signal with a set of logic paths, which all use 1 of 4 encoding. The preferred embodiment of the present invention uses 1 of 4 encoding. Other embodiments of present invention include the use of 1 of 2 signals with 1 of 2 encoding, 1 of 3 signals with 1 of 3 encoding, 1 of 8 signals with 1 of 8 encoding, and the general embodiment of 1 of N signals with 1 of N encoding. The logic tree circuit evaluates a given function that includes, for example, an AND/NAND function, an OR/NOR function, or an XOR/Equivalence function. The logic tree circuit uses a single, shared logic tree with multiple evaluation paths for evaluating the function of the logic circuit. The device of the present invention further comprises a precharge circuit that precharges the transistors in the logic tree circuit and an evaluate circuit that controls the logic tree circuit's evaluation where both couple to the logic tree circuit. And finally, a clock signal couples to the precharge circuit and the evaluate circuit.

The present invention additionally comprises a method and apparatus for an integrated circuit (IC) that uses 1 of N signals to reduce both the circuit's power consumption and the circuit's wire to wire capacitance. The present invention comprises a logic tree circuit coupled to a first 1 of N input signal, a second 1 of N input signal, and a 1 of N output signal where the 1 of N signals' reduce the signal's power consumption and wire to wire capacitance. Other embodiments of the present invention include the use of a 1 of 2 signal, 1 of 3 signal, a 1 of 4 signal, and a 1 of 8 signal where one and one of the wires of the signal is active.

The present invention additionally comprises a method and apparatus for routing 2 bits of information with a datapath in a semiconductor device using a 1 of 4 signal. The present invention comprises a first, second, third, and fourth wire for routing a 1 of 4 signal with 1 of 4 encoding in a semiconductor device. One and only one wire of the first, second, third, or fourth wire is active during the evaluation cycle and each active wire represents 2 bits worth of information. Additionally, one and only one wire of the first, second, third, or fourth wire is active during a precharge cycle. The datapath may couple to a logic device. And, other embodiments of the present invention include the ability to route non-inverting signals.

Other embodiments of the invention will be apparent to those skilled in the art after considering this specification or practicing the disclosed invention. The specification and examples above are exemplary only, with the true scope of the invention being indicated by the following claims.

We claim:

1. A N-nary logic circuit that uses 1 of N signals with 1 of N encoding, comprising:

a shared logic tree circuit that evaluates one or more input signals and produces an output signal;

a first input 1 of N signal coupled to said shared logic tree circuit wherein said first input 1 of N signal comprises a first bundle of N wires routed together between different cells and use a 1 of N encoding to indicate multiple values of information conveyed by said first bundle of wires and where at most one and only one wire of said first bundle of wires is true during an evaluation cycle;

a second input 1 of N signal coupled to said shared logic tree circuit wherein said second input 1 of N signal comprises a second bundle of N wires routed together between different cells and use a 1 of N encoding to indicate multiple values of information conveyed by said second bundle of wires and where at most one and only one wire of said second bundle of wires is true during said evaluation cycle;

an output 1 of N signal coupled to said shared logic tree circuit wherein said output 1 of N signal comprises a third bundle of N wires routed together between different cells and use a 1 of N encoding to indicate multiple values of information conveyed by said third bundle of wires and where at most one and only one wire of said third bundle of wires is true during said evaluation cycle.

2. The logic circuit of claim 1 wherein said shared logic tree circuit evaluates the function selected from the functions comprising AND/NAND, OR/NOR, or XOR/Equivalence.

3. The logic circuit of claim 1 that further comprises a single evaluation device coupled to said shared logic tree circuit.

4. The logic circuit of claim 1 wherein said 1 of N encoding further comprises a not valid value wherein zero wires of said first bundle of wires, said second bundle of wires, or said third bundles of wires are true.

5. The logic circuit of claim 1 wherein said 1 of N signal of said first input 1 of N signal, said second input 1 of N signal, or said output 1 of N signal comprises a 1 of 4 signal comprising a bundle of 4 wires routed together.

6. The logic circuit of claim 1 wherein said 1 of N signal of said first input 1 of N signal, said second input 1 of N signal, or said output 1 of N signal comprises a 1 of 3 signal comprising a bundle of 3 wires routed together.

7. A system that evaluates a N-Nary logic circuit that uses 1 of N signals with 1 of N encoding, comprising:

a shared logic tree circuit that evaluates one or more input signals and produces an output signal;

a first input 1 of N signal coupled to said shared logic tree circuit wherein said first input 1 of N signal comprises a first bundle of N wires routed together between different cells and use a 1 of N encoding to indicate multiple values of information conveyed by said first bundle of wires and where at most one and only one wire of said first bundle of wires is true during an evaluation cycle;

a second input 1 of N signal coupled to said shared logic tree circuit wherein said second input 1 of N signal comprises a second bundle of N wires routed together between different cells and use a 1 of N encoding to indicate multiple values of information conveyed by said second bundle of wires and where at most one and only one wire of said second bundle of wires is true during said evaluation cycle; and an output 1 of N signal coupled to said shared logic tree circuit wherein said output 1 of N signal comprises a third bundle of N wires routed together between different cells and use a 1 of N encoding to indicate multiple values of information conveyed by said third bundle of wires and where at most one and only one wire of said third bundle of wires is true during said evaluation cycle.

8. The system of claim 7 wherein said shared logic tree circuit evaluates the function selected from the functions comprising AND/NAND, OR/NOR, or XOR/Equivalence.

9. The system of claim 7 that further comprises a single evaluation device coupled to said shared logic tree circuit.

10. The system of claim 7 wherein said 1 of N encoding further comprises a not valid value wherein zero wires of said first bundle of wires, said second bundle of wires, or said third bundles of wires are true.

11. The system of claim 7 wherein said 1 of N signal of said first input 1 of N signal, said second input 1 of N signal, or said output 1 of N signal comprises a 1 of 4 signal comprising a bundle of 4 wires routed together.

12. The system of claim 7 wherein said 1 of N signal of said first input 1 of N signal, said second input 1 of N signal, or said output 1 of N signal comprises a 1 of 3 signal comprising a bundle of 3 wires routed together.

13. A method that evaluates a N-Nary logic circuit that uses 1 of N signals with 1 of N encoding, comprising:

receiving a first input 1 of N signal coupled to a shared logic tree circuit wherein said first input 1 of N signal comprises a first bundle of N wires routed together between different cells and use a 1 of N encoding to indicate multiple values of information conveyed by said first bundle of wires and where at most one and only one wire of said first bundle of wires is true during an evaluation cycle;

receiving a second input 1 of N signal coupled to said shared logic tree circuit wherein said second input 1 of N signal comprises a second bundle of N wires routed together between different cells and use a 1 of N encoding to indicate multiple values of information conveyed by said second bundle of wires and where at most one and only one wire of said second bundle of wires is true during said evaluation cycle;

evaluating said first input 1 of N signal and said second input 1 of N signal with said shared logic tree circuit; and producing an output 1 of N signal from said shared logic tree circuit's evaluation, said output 1 of N signal couples to said shared logic tree circuit wherein said output 1 of N signal comprises a third bundle of N wires routed together between different cells and use a 1 of N encoding to indicate multiple values of information conveyed by said third bundle of wires and where at most one and only one wire of said third bundle of wires is true during said evaluation cycle.

14. The method of claim 13 wherein said shared logic tree circuit evaluates the function selected from the functions comprising AND/NAND, OR/NOR, or XOR/Equivalence.

15. The method of claim 13 that further comprises a single evaluation device coupled to said shared logic tree circuit.

16. The method of claim 13 wherein said 1 of N encoding further comprises a not valid value wherein zero wires of said first bundle of wires, said second bundle of wires, or said third bundles of wires are true.

17. The method of claim 13 wherein said 1 of N signal of said first input 1 of N signal, said second input 1 of N signal, or said output 1 of N signal comprises a 1 of 4 signal comprising a bundle of 4 wires routed together.

18. The method of claim 13 wherein said 1 of N signal of said first input 1 of N signal, said second input 1 of N signal, or said output 1 of N signal comprises a 1 of 3 signal comprising a bundle of 3 wires routed together.

19. A method that provides a N-Nary logic circuit with 1 of N signals using 1 of N encoding, comprising:

providing a shared logic tree circuit that evaluates one or more input signals and produces an output signal;

coupling a first input 1 of N signal to said shared logic tree circuit wherein said first input 1 of N signal comprises a first bundle of N wires routed together between different cells and use a 1 of N encoding to indicate multiple values of information conveyed by said first bundle of wires and where at most one and only one wire of said first bundle of wires is true during an evaluation cycle;

coupling a second input 1 of N signal to said shared logic tree circuit wherein said second input 1 of N signal comprises a second bundle of N wires routed together between different cells and use a 1 of N encoding to indicate multiple values of information conveyed by said second bundle of wires and where at most one and only one wire of said second bundle of wires is true during said evaluation cycle; and coupling an output 1 of N signal to said shared logic tree circuit wherein said output 1 of N signal comprises a third bundle of N wires routed together between different cells and use a 1 of N encoding to indicate multiple values of information conveyed by said third bundle of wires and where at most one and only one wire of said third bundle of wires is true during said evaluation cycle.

20. The method of claim 19 wherein said shared logic tree circuit evaluates the function selected from the functions comprising AND/NAND, OR/NOR, or XOR/Equivalence.

21. The method of claim 19 that further comprises a single evaluation device coupled to said shared logic tree circuit.

22. The method of claim 19 wherein said 1 of 4 encoding further comprises a not valid value wherein zero wires of said first bundle of wires, said second bundle of wires, or said third bundles of wires are true.

23. The method of claim 19 wherein said 1 of N signal of said first input 1 of N signal, said second input 1 of N signal, or said output 1 of N signal comprises a 1 of 4 signal comprising a bundle of 4 wires routed together.

24. The method of claim 19 wherein said 1 of N signal of said first input 1 of N signal, said second input 1 of N signal, or said output 1 of N signal comprises a 1 of 3 signal comprising a bundle of 3 wires routed together.

* * * * *

UNITED STATES PATENT AND TRADEMARK OFFICE
CERTIFICATE OF CORRECTION

PATENT NO. : 6,069,497
DATED : May 30, 2000
INVENTOR(S) : Blomgren et al.

It is certified that error appears in the above-identified patent and that said Letters Patent is hereby corrected as shown below:

Column 7,
Line 67, replace "N" with -- 2 --.

Column 8,
Line 13, after the word "available," insert the word -- zero --.

Column 11,
Line 48, after the word "communicate" insert the number -- 8 --.

Column 21,
Line 57, replace "one and one" with -- one and only --.

Signed and Sealed this

Twenty-third Day of October, 2001

Attest:

NICHOLAS P. GODICI
Attesting Officer    Acting Director of the United States Patent and Trademark Office